(12) United States Patent
Morino et al.

(10) Patent No.: US 9,587,970 B2
(45) Date of Patent: Mar. 7, 2017

(54) AIRFLOW MEASURING APPARATUS INCLUDING A VENTILATION HOLE BETWEEN A CONNECTOR PART AND A CIRCUIT CHAMBER

(75) Inventors: Takeshi Morino, Hitachinaka (JP); Shinobu Tashiro, Hitachinaka (JP); Noboru Tokuyasu, Hitachinaka (JP); Ryosuke Doi, Hitachinaka (JP); Keiji Hanzawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 313 days.

(21) Appl. No.: 14/363,235

(22) PCT Filed: Dec. 7, 2011

(86) PCT No.: PCT/JP2011/006833
§ 371 (c)(1),
(2), (4) Date: Jul. 11, 2014

(87) PCT Pub. No.: WO2013/084259
PCT Pub. Date: Jun. 13, 2013

(65) Prior Publication Data
US 2014/0352424 A1 Dec. 4, 2014

(51) Int. Cl.
*G01F 1/68* (2006.01)
*G01F 1/684* (2006.01)
(Continued)

(52) U.S. Cl.
CPC ......... *G01F 1/6842* (2013.01); *F02D 41/187* (2013.01); *G01F 1/6845* (2013.01);
(Continued)

(58) Field of Classification Search
CPC ........ G01F 1/6842; G01F 5/00; G01F 1/6845; G01F 15/12; G01F 1/684; G01F 1/698;
(Continued)

(56) References Cited

U.S. PATENT DOCUMENTS

| | | | | |
|---|---|---|---|---|
| 6,516,785 B1 * | 2/2003 | Nakada | ................... | G01F 1/684 |
| | | | | 123/494 |
| 7,437,927 B2 * | 10/2008 | Yamada | ................ | G01F 1/6842 |
| | | | | 73/204.21 |
| 2007/0089503 A1* | 4/2007 | Nakano | ................. | G01F 1/6842 |
| | | | | 73/204.26 |

FOREIGN PATENT DOCUMENTS

| | | |
|---|---|---|
| EP | 1 643 219 A2 | 4/2006 |
| EP | 1 895 278 A2 | 3/2008 |

(Continued)

OTHER PUBLICATIONS

PCT International Search Report on application PCT/JP2011/006833 mailed Mar. 6, 2012; 2 pages.

(Continued)

*Primary Examiner* — Lisa Caputo
*Assistant Examiner* — Brandi Hopkins
(74) *Attorney, Agent, or Firm* — Foley & Lardner LLP

(57) ABSTRACT

An airflow measuring apparatus includes a sub-passage that takes in part of flow of fluid flowing through an intake pipe, a sensor element disposed in the sub-passage to measure the flow of fluid, a circuit part converting the flow of fluid detected by the sensor element into an electric signal, a connector part connected to the circuit part to output a signal externally, and a casing supporting the sensor element and the circuit part. The sensor element is disposed in the intake pipe, and includes a cavity disposed at a semiconductor substrate and a diaphragm including a thin film part that covers the cavity. The sensor element on a lead frame has surfaces that are mold-packaged with resin so that the diaphragm and part of the lead frame are exposed. One hole is disposed at the lead frame for communication between the cavity and exterior.

15 Claims, 27 Drawing Sheets

(51) Int. Cl.
    *G01F 1/692* (2006.01)
    *G01F 5/00* (2006.01)
    *F02D 41/18* (2006.01)
    *H01L 35/34* (2006.01)

(52) U.S. Cl.
    CPC ............... *G01F 1/692* (2013.01); *G01F 5/00* (2013.01); *H01L 35/34* (2013.01)

(58) Field of Classification Search
    CPC ........ G01F 1/692; G01F 1/699; F02D 41/187; H01L 29/66992
    USPC ... 73/204.21, 118.2, 204.26, 204.18, 204.11, 73/203, 204.23, 204.22
    See application file for complete search history.

(56) References Cited

FOREIGN PATENT DOCUMENTS

EP       2 339 302 A2    6/2011
JP       2008-020193 A    1/2008

OTHER PUBLICATIONS

PCT Written Opinion on application PCT/JP2011/006833 mailed Mar. 6, 2012; 4 pages.
European Patent Office extended search report on application 11876912.4 dated Jun. 29, 2015; 3 pages.

\* cited by examiner (a)

(b)

(c)

(a)

(b)

A-A (a)

(b)

C—C (a)

(b)

(a)

(b)
E-E (a)

(b)

(a)

(b)

C-C (a)

(b)

D-D (a)

(b)

(a)

(b)

C-C (a)

(b)

D-D (a)

(b)

E-E

AIRFLOW MEASURING APPARATUS INCLUDING A VENTILATION HOLE BETWEEN A CONNECTOR PART AND A CIRCUIT CHAMBER

TECHNICAL FIELD

The present invention relates to flow measuring apparatuses to measure the flow of fluid, and particularly relates to airflow measuring apparatuses that are suitable for intake airflow of an internal combustion engine for automobile.

BACKGROUND ART

Conventionally heat-generation type airflow sensors are becoming the mainstream to measure the intake airflow, which are installed in an intake air passage of an internal combustion engine in automobile or the like, because such a type of sensor can detect mass airflow.

A sensor element can be formed as a thinner film partially by a semiconductor micromachining technique, whereby the airflow sensor can have high-speed responsivity. Hereinafter this thin-film part is called a diaphragm. On the diaphragm, a heating resistor and two or more thermosensitive resistors adjacent to the heating resistor are formed by patterning. The heating resistor is uniformly controlled to generate heat to be at a predetermined temperature or higher than the surrounding temperature, and the temperature distribution thereof is detected by the thermosensitive resistors. Since the temperature distribution changes with the amount of airflow passing over the sensor element, the variation in temperature distribution is detected by the thermosensitive resistors disposed upstream and downstream of the airflow direction, whereby the mass airflow can be measured.

As means for such a heat-generation type airflow meter using a sensor element, the sensor element and a lead frame to mount the sensor element thereon are surrounded with resin as a package by transfer molding, for example.

This is for reducing the number of components or the number of connections compared with the structure including a sensor element and a circuit mounted on a substrate made of ceramic or the like.

Such a sensor element and the thermal flow meter including such a packaged sensor element have the following problems.

To begin with, when stress is applied to the heating resistor and the thermosensitive resistors disposed on the diaphragm, their values of resistance change due to Piezoresistive effect, which becomes an erroneous cause of the mass airflow detected. If a pressure difference occurs between the surface and the rear face of the diaphragm part, the diaphragm part is deformed, so that stress is applied to the heating resistor and the thermosensitive resistors. To avoid this, there is a need to suppress such a pressure difference between the surface and the rear face of the diaphragm part.

As a method to reduce the pressure difference between the surface and the rear face of the diaphragm, Patent Literature 1 provides an opening at the surface of a diaphragm or at the rear face of a substrate to mount a sensor element thereon for communication between a cavity at the rear face of the diaphragm and the atmospheric pressure at the surface of the diaphragm.

CITATION LIST

Patent Literature

Patent Literature 1: JP 2008-20193 A

SUMMARY OF INVENTION

Technical Problem

The method described in Patent Literature 1, however, cannot avoid contaminants or droplet completely from entering through the opening at the surface of the diaphragm or on the side of the rear face of the substrate to support the diaphragm, because the opening is exposed to the interior of the intake pipe.

When the sensor element is mounted on a lead frame, followed by packaging by transfer molding, the cavity part at the rear face of the diaphragm will be completely cut off from the air. This means that, if the surrounding temperature of the chip package changes, the volume of the air in the cavity at the rear face of the diaphragm changes, and so a difference in pressure between the atmospheric pressure applied to the surface of the diaphragm and the air pressure at the rear face of the diaphragm deforms the diaphragm. This deformation changes the values of resistance of the heating resistor and the thermosensitive resistors on the diaphragm change due to Piezoresistive effect, thus generating an error in the mass airflow detected.

In this way, there is a need to establish a communication between the space at the rear face of the diaphragm part and the atmosphere to remove a difference in air pressure between the surface and the rear face of the diaphragm due to the influences from temperature.

On the diaphragm, a heating resistor is disposed to detect the flow, and water droplet or contaminations in the intake pipe will fly to the diaphragm part as stated above. Although an opening has to be bored to remove the difference in air pressure so as to lead the space at the rear face of the diaphragm part to any part of the thermal airflow meter, if such an opening is bored at the position that is exposed to the interior of the intake pipe, contaminations or water droplet reaching the opening may block the opening.

There is another problem of displacement of the mounting position of the sensor element. As stated above, the temperature distribution generated by a heater is based on the detection of the flow rate of air passing over its surface. Since the flow-rate distribution in a bypass-passage to mount a sensor element is not uniform, the displacement of the sensor element mounted causes a change in the flow detected by such a sensor element, meaning that the mass airflow cannot be measured correctly. To prevent this, there is a need to mount a sensor element precisely in the package.

It is an object of the present invention to provide an airflow measuring apparatus with good measurement accuracy.

Solution to Problem

To fulfill the above object, an airflow measuring apparatus of the present invention includes: a sub-passage that takes in a part of a flow of fluid flowing through an intake pipe; a sensor element that is disposed in the sub-passage to measure the flow of fluid; a circuit part that converts the flow of fluid detected by the sensor element into an electric signal; a connector part having a connector that is electrically connected to the circuit part to output a signal externally; and a casing that supports the sensor element and the circuit part, the sensor element being disposed in the intake pipe. The sensor element includes a cavity that is disposed at a semiconductor substrate, and a diaphragm including a thin film part that covers the cavity. The sensor element is mounted at a lead frame. The sensor element and the lead frame have surfaces that are mold-packaged with resin so that a diaphragm part of the sensor element and a part of the lead frame are exposed. At least one hole is disposed at the lead frame for communication between the cavity and exterior of the mold package.

Advantageous Effects of Invention

The present invention can provide an airflow measuring apparatus with good measurement accuracy.

DESCRIPTION OF EMBODIMENTS

The following describes embodiments of the present invention in details, with reference to the drawings.

Embodiment 1

The following describes Embodiment 1 that is one embodiment of the present invention.

Figure 1:
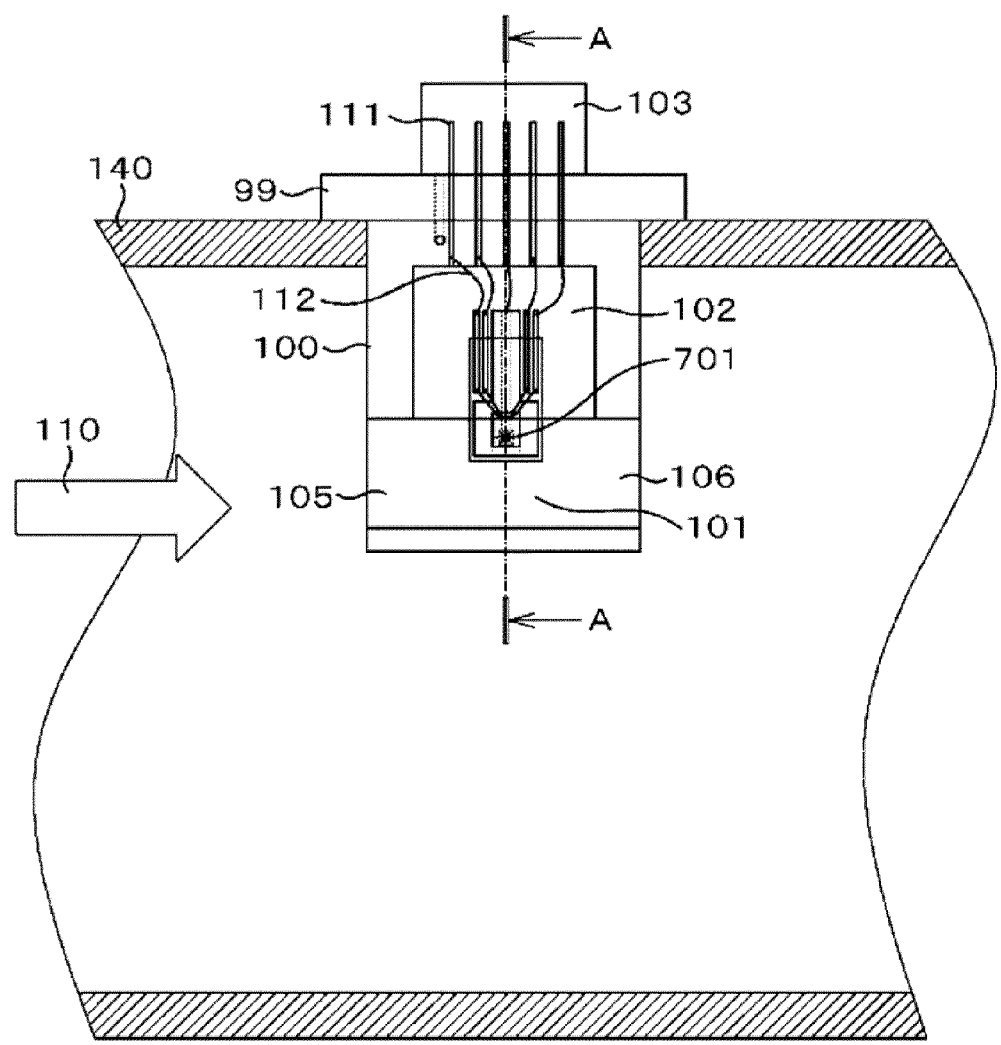
FIG. 1 illustrates the state to mount a thermal airflow meter to an intake pipe.

As illustrated in FIG. 1, a thermal flow meter 100 is attached at its flange part 99 to an intake pipe 140 by mechanical fastening such as using a screw. The thermal flow meter 100 roughly includes a bypass-passage 101, a circuit chamber 102 and a connector part 103, and is electrically connected to an ECU that controls an engine via a connector lead 111 in the connector part 103. Intake air 110 flowing through the intake pipe 140 enters the bypass-passage through an upstream-side opening 105 of the thermal flow meter 100 and goes out through a downstream-side opening 106. A sensor element 701 is disposed in the bypass-passage 101 to detect the flow of air that is branched off into the bypass-passage 101 out of the intake air 110 passing through the intake pipe 140.

Figure 2:
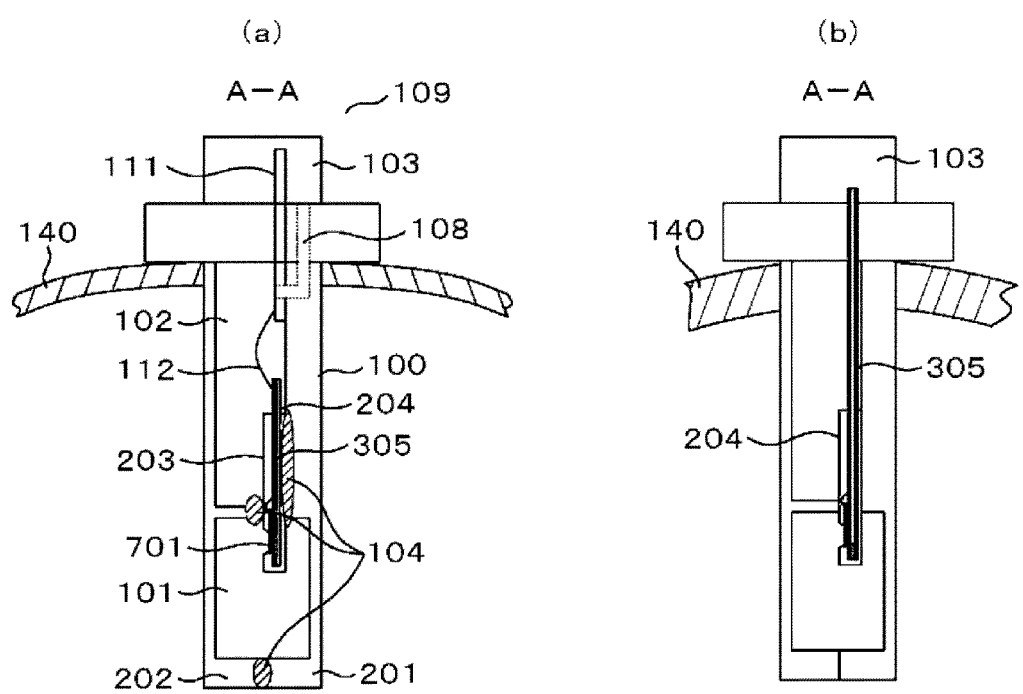
FIG. 2 illustrates the structure of a thermal airflow meter and its components.

Referring to FIG. 2 that is a cross section taken along A-A of FIG. 1, the following describes components making up the thermal flow meter 100 and the structure.

The circuit chamber 102 and the bypass-passage 101 of the thermal flow meter 100 are surrounded with a housing member 201, a cover member 202, and a chip package 203 containing the sensor element 701 and its driving circuit.

These members are mutually bonded at their periphery with thermosetting adhesive 104. This can keep the interior of the circuit chamber 102 airtight perfectly, and intake air 110 passing through the sub-passage 101 does not enter the circuit chamber 102. Such perfect airtightness of the circuit chamber, however, causes expansion of air in the circuit chamber during heating of the thermosetting adhesive 104 for curing, and so the housing member 201 and the cover member 202 may not be bonded correctly.

To avoid this, such expanded air has to be released from the circuit chamber 102, and so a ventilation hole 108 is bored at the connector part 103 to communicate with the circuit chamber 102 for communication between the air inside the circuit chamber 102 and the atmosphere 109 outside the intake Pipe.

An outer lead 305 of the chip package 203 and the connector lead 111 inside the connector part 103 are electrically connected via aluminum wire 112, for example. Herein as illustrated in FIG. 2(b), the outer lead 305 of the chip package may double as the connector lead 111, and in this case, the aluminum wire 112 and the circuit chamber 102 may be omitted.

Figure 3:
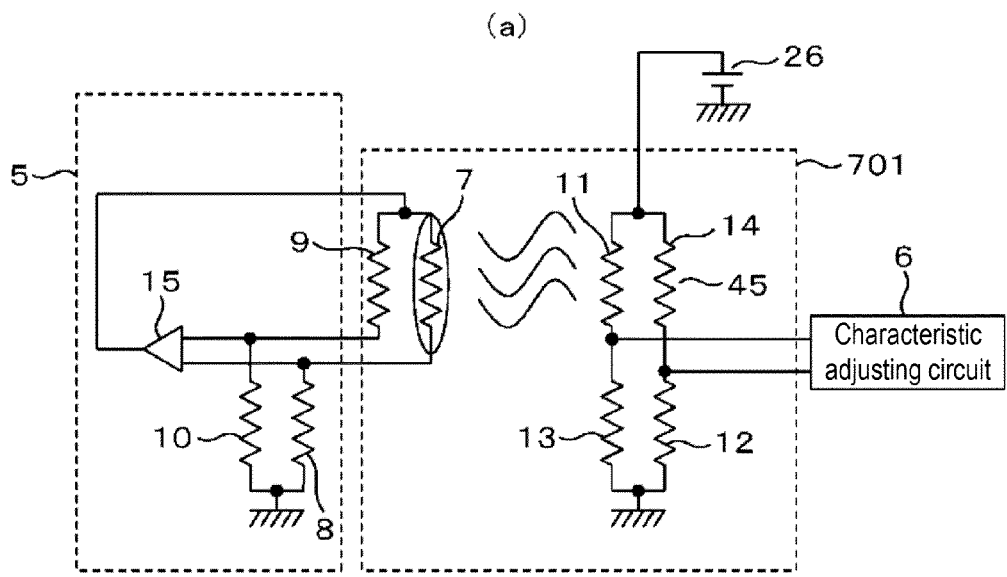
FIG. 3 illustrates a detection part of a sensor element.
Figure 3:
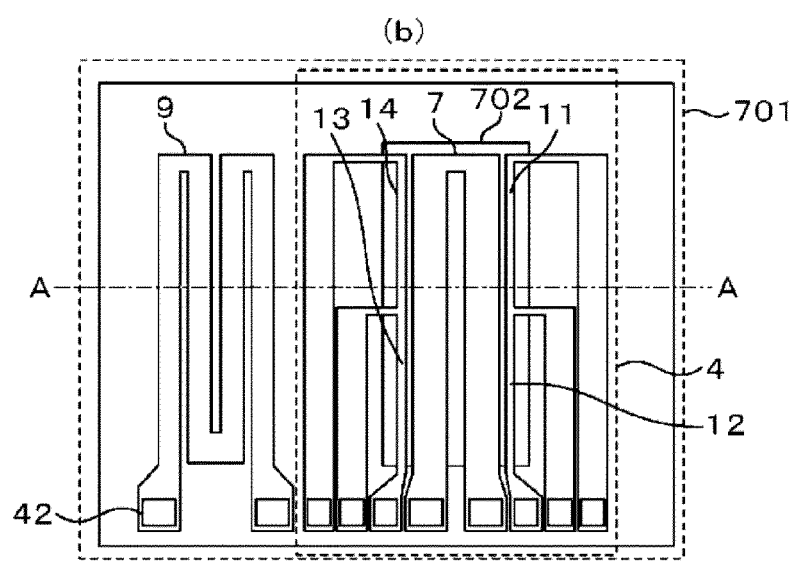
Figure 3:
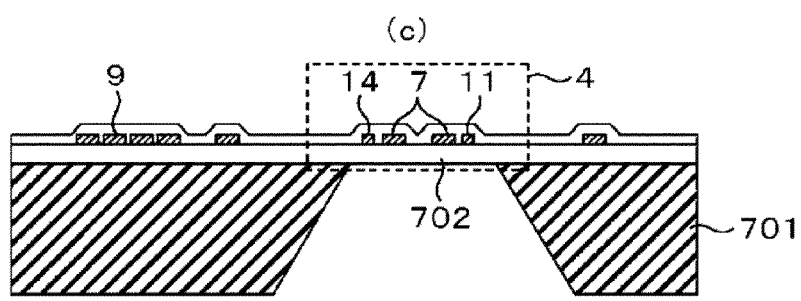

FIG. 3(a) illustrates the minimum circuit configuration of a flow detection part, FIG. 3(b) illustrates the configuration of the flow detection part and FIG. 3(c) is a cross-sectional view taken along A-A of FIG. 3(b). Referring to these drawings, the following describes a typical example of the flow detection part that is formed by patterning on a detection part diaphragm 702 and its operation principle.

On the diaphragm 702, a flow detection part 4 is formed by patterning. The flow detection part 4 includes a heater resistor (heating resistor) 7 and a non-thermal resistor (thermosensitive resistor) 9, and they are connected to a driving circuit 5 that is provided separately from the flow detection part 4. The heater resistor 7 generates heat when being energized by current fed from the driving circuit 5 described later, so as to heat the surrounding fluid (air) to be at a temperature higher than the surrounding temperature at least. The non-thermal resistor 9 detects a temperature of the fluid surrounding the flow detection part, and the heater resistor 7 is heat-controlled by the driving circuit 5 so that the temperature thereof is higher than the detected temperature by a predetermined temperature or more.

The flow detection part 4 further includes temperature sensors (temperature detection resistors) 11, 12 disposed adjacent to the downstream of the heater resistor 7 and temperature sensors (temperature detection resistors) 13, 14 disposed adjacent to the upstream of the heater resistor 7, which are connected to a constant voltage source 26 that is separately provided from the flow detection part 4 and make up a bridge circuit 45.

The driving circuit 5 includes fixed resistors 8, 10 and an operational amplifier 15 disposed therein, and so is configured as a heater control circuit to heat-control the heater resistor 7. This driving circuit 5 allows current from the operational amplifier 15 to be fed to the heater resistor 7 so as to heat-control the heater resistor 7 based on the detection temperature of the non-thermal resistor 9 until the heating temperature of the heater resistor 7 has a predetermined value relative to the surrounding temperature (fluid).

In this way, a change in temperature distribution (heat quantity) of the fluid between the temperature sensors 13 and 14 disposed adjacent to the upstream of the heater resistor 7 and the temperature sensors 11 and 12 disposed adjacent to the downstream of the heater resistor 7 can be detected as the flow of the fluid (detected flow Q). When the mass airflow changes, thermal influences from the heater resistors on the temperature sensors 13 and 14 disposed adjacent to the upstream and the temperature sensors 11 and 12 disposed adjacent to the downstream of the heater resistor 7 change, and such a change is detected, whereby a voltage signal corresponding to the mass airflow and its direction can be obtained.

As illustrated in FIG. 3(b), the heater resistor 7 has a folded pattern of a resistor to be oblong, on both sides of which (upstream and downstream sides) the temperature sensors 11 and 12 and the temperature sensors 13 and 14 are disposed. The heater resistor 7 and the temperature sensors 11, 12, 13 and 14 are disposed on the diaphragm 702 that is formed by etching from the rear face of the sensor element 701 as a silicon substrate, for example, to have a small thermal capacity. The non-thermal resistor 9 may be disposed at a place less susceptible to temperature influences from heating of the heater resistor 7, e.g., at a place outside of the diaphragm 702. These elements are connected for electrical connection with a circuit part by gold wire bonding, for example, from an electrode extraction part 42. In the present embodiment, the potential at the midpoint of the bridge including the temperature sensors 11, 12, 13 and 14 is input to a characteristic adjusting circuit 6.

Figure 4:
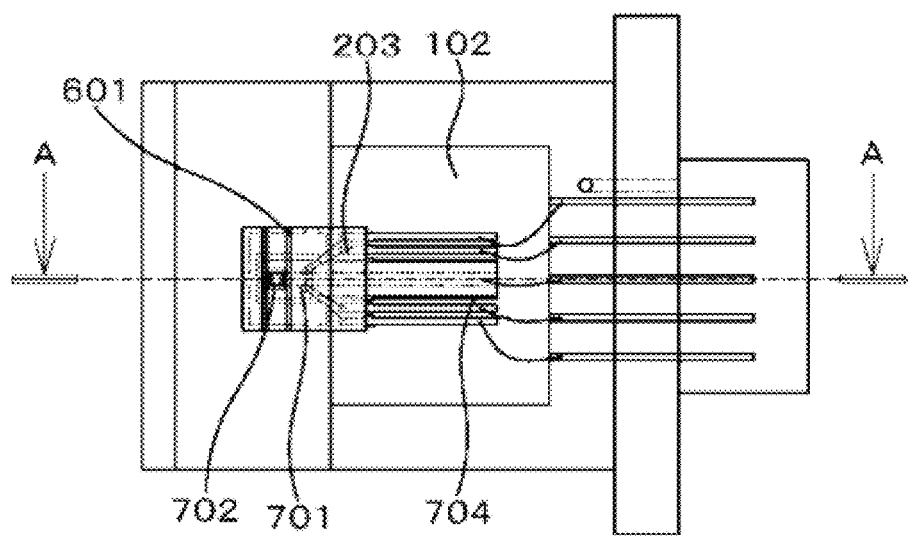
FIG. 4 includes a plan view and cross sectional views of a chip package that is Embodiment 1.
Figure 4:
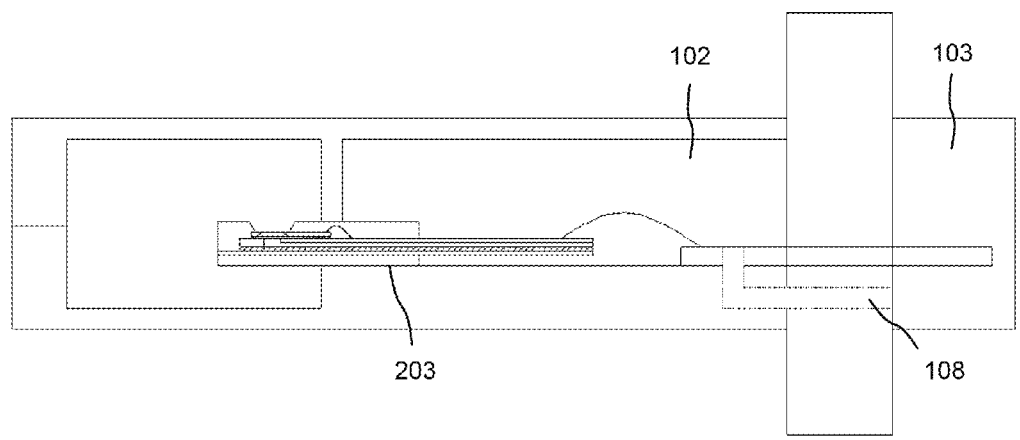
Figure 4:
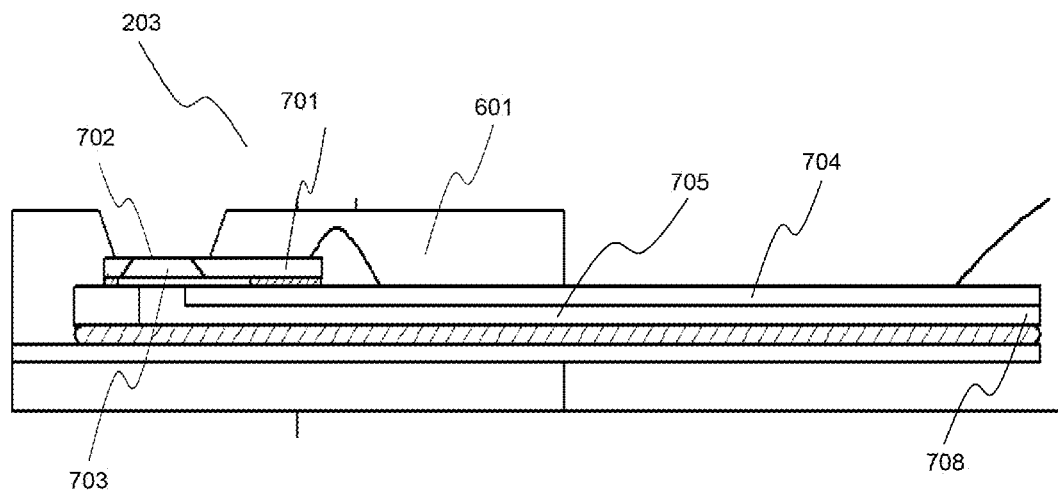
Figure 5:
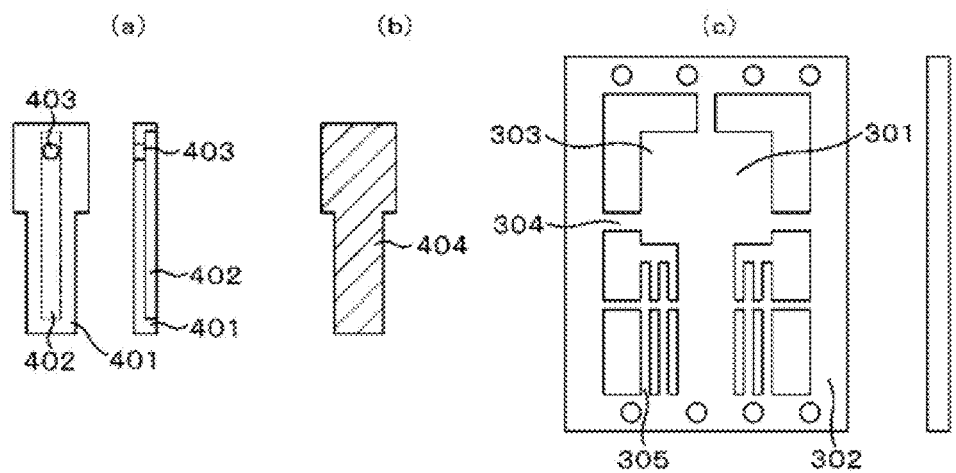
FIG. 5 includes a plan view and a cross sectional view (1) illustrating the shapes of a cover frame, adhesive and a lead frame that are components of a lead frame assembly that is Embodiment 1.
Figure 6:
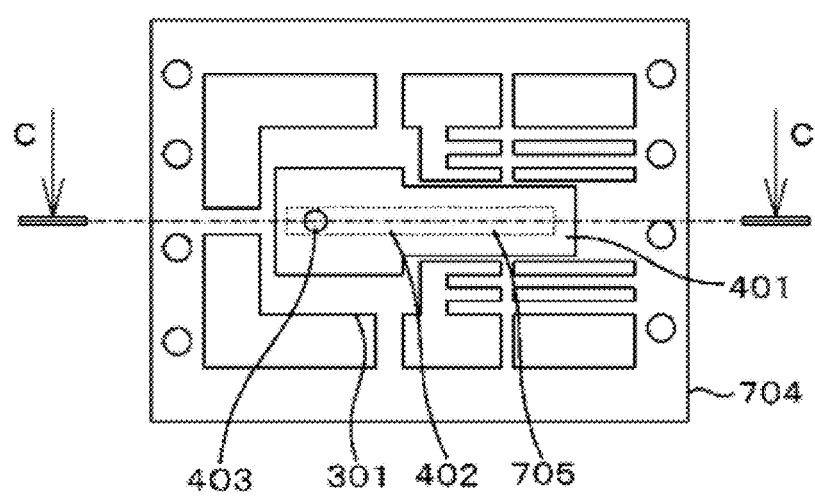
FIG. 6 includes a plan view and a cross sectional view illustrating a step of Embodiment 1 in the state where a cover frame is mounted.
Figure 6:
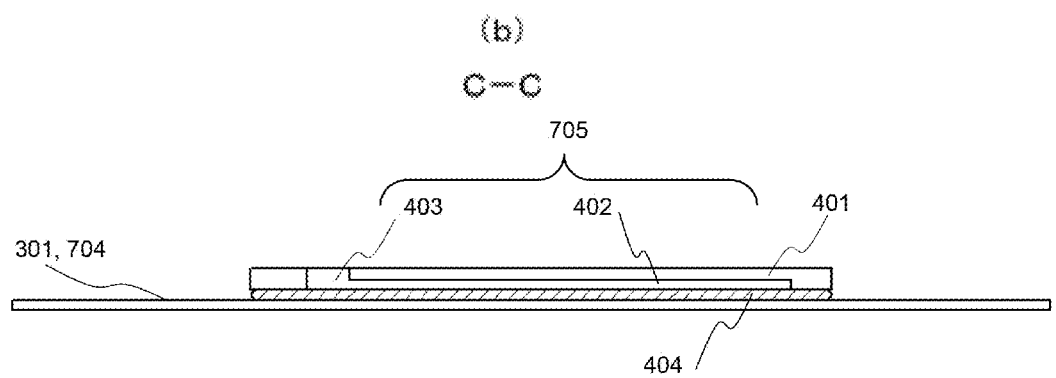

Referring next to FIG. 4(a) that is a front view of a package illustrating the internal configuration with broken lines, FIG. 4(b) that is a cross-sectional view of FIG. 4(a), and FIG. 4(c) that is an enlarged view of a portion of FIG. 4(b), the following describes the shape of the chip package 203.

The sensor element 701 typically has a rectangular shape. At the detection part of the sensor element 701, the diaphragm 702 is disposed as described above, and this diaphragm 702 is disposed inside the sub-passage 101 illustrated in FIG. 1, through which air as a measurement target flows.

The diaphragm 702 is formed by etching from the rear-face direction of the sensor element 701 as stated above, and a cavity 703 is formed at the rear face. The diaphragm 702 is made to be a thin film mainly because a thinner film can decrease the thermal capacity, leading to advantages of improving thermal responsivity as well as lowering power consumption.

The cavity 703 below the diaphragm 702 and the circuit chamber 102 communicate with each other via a communication hole 705 bored at a lead frame 704. The lead frame 704 may be made of a material such as Cu or Fe—Ni having a thickness from about 0.1 mm to 1 mm. When the diaphragm 702 and the circuit chamber 102 communicate with each other, the communication hole 705 has to be bored at the lead frame 704 or a resin part 601 of the chip package 203. Boring of a hole at the resin part 601 or at the lead frame 704 by additional process after packaging means an increase in the number of steps compared with the conventional packaging procedure, and such a step includes micro-machining, and so requires high level of difficulty for machining.

Then, the present invention provides the communication hole 705 inside the lead frame 704 by the following procedure for communication between the circuit chamber 102 and the cavity 703 under the diaphragm. In the following, an assembly (including a lead frame 301, a cover frame 401 and adhesive 404 in the present embodiment) of the minimum components of the lead frame 704 to configure the communication hole 705 is called a lead frame assembly 704.

Referring to FIGS. 5 to 8, the following describes the manufacturing procedure of the chip package 203.

Firstly, the cover frame 401 and the lead frame 301 are prepared. Hereinafter, the aforementioned first lead frame and second lead frame are called the cover frame 401 and the lead frame 301, respectively. Referring to FIGS. 5(a)(b) and (c), the following describes the shapes of the cover frame 401, the lead frame 301 and the adhesive 404 to bond the cover frame 401 and the lead frame 301.

Firstly, the configuration of the lead frame 301 is described with reference to FIG. 5(c). The lead frame 301 includes an outer frame 302, a die pad 303 to mount an electronic component such as a sensor element and the cover frame 401 thereon, a tie bar 304 to joint the outer frame 302 to the die pad so as not to cause displacement of these components due to influences from resin flow that may occur during molding by transfer molding described later, and an outer lead 305 of the chip package.

Next, the configuration of the cover frame 401 is described with reference to FIG. 5(a).

The cover frame 401 includes a groove 402 (hereinafter called a communication groove 402) to release air from the cavity 703 below the diaphragm, which is formed by half etching or pressing, and a through hole 403 passing through the groove part, which is bored at a part immediately below the diaphragm in the area where the sensor element is to be die-bonded. Such a cover frame 401 is overlaid to the lead frame 301 with the sheet adhesive 404 illustrated in FIG. 5(b).

FIG. 6(a) is a front view illustrating the state where the lead frame 301 and the cover frame 401 are bonded with the adhesive 404, and FIG. 6(b) is a cross sectional view thereof. Bonding of the lead frame 301 and the cover frame 401 via the adhesive 404 forms a closed space that communicates with the through hole 403. Hereinafter this closed space defines the communication hole 705. In some embodiments, the communication hole 705 comprises the through hole 403 and the communication groove 402.

FIG. 7(a) is a front view illustrating the state where the sensor element 701 is structurally or electrically bonded to the lead frame assembly 704, and FIG. 7(b) is a cross sectional view thereof.

After applying a die-bond material 501 made of Ag paste or thermosetting adhesive so as to surround the through hole on the cover frame 401, the sensor element 701 is die-bonded, and the die-bond material 501 and the adhesive 404 are heated in an oven for curing. Herein, the lead frame 301 and the cover frame 401 may be made of the same type of materials or different types of materials, between which one that is suitable for the overall shape of the chip package 203 may be selected. For instance, when the area of the lead frame 301 is sufficiently larger than that of the cover frame 401, the cover frame 401 may be made of a material having a linear expansion coefficient closer to that of the sensor element 701 than that of the lead frame 301, whereby stress applied to the sensor element 701 during heating for curing can be alleviated.

Then, the electrode extraction part 42 on the sensor element 701 and a bonding part 503 on the lead frame 301 are connected by wire bonding using Au wire 504.

FIG. 8(a) is a front view illustrating the state where molding is performed for the lead frame assembly 704 on which the sensor element 701 has been mounted, and FIG. 8(b) is a cross sectional view illustrating the state where the lead frame assembly is set in a mold.

Figure 7:
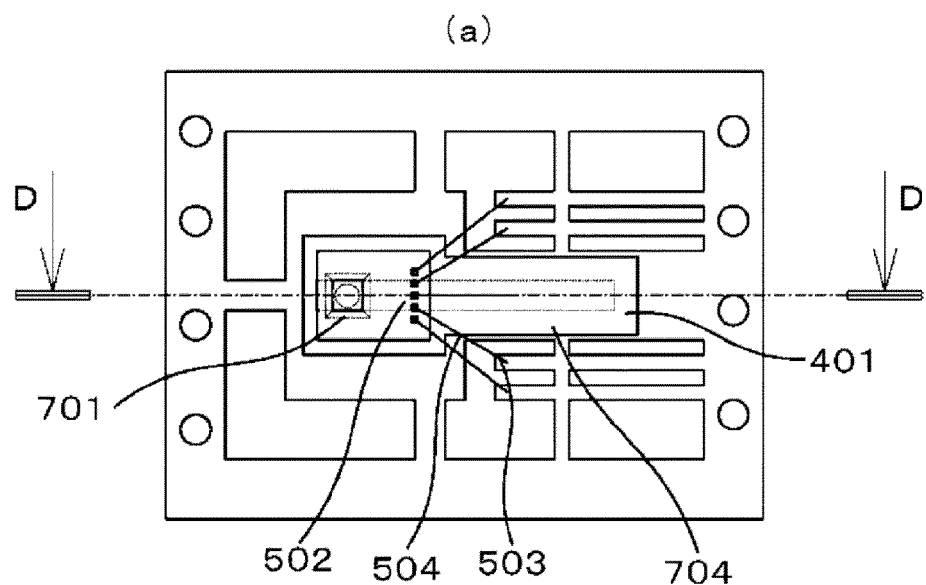
FIG. 7 includes a plan view and a cross sectional view illustrating a step of Embodiment 1 in the state where a sensor element is mounted at a lead frame assembly.
Figure 7:
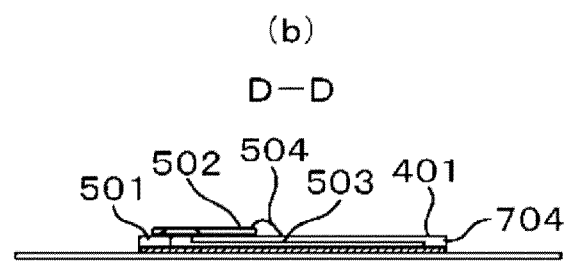

The lead frame assembly 704 on which the sensor element 701 has been mounted, which is prepared by the procedure till FIG. 7 as stated above, is set on a lower mold for transfer molding 1103, which is then sandwiched with an upper mold for transfer molding 1102. Thermosetting resin such as epoxy or polyamide that is heated to about 200° C. to 300° C. is injected into the space defined between the lower mold for transfer molding 1103 and the upper mold for transfer molding 1102 at an injection pressure of about 5 to 10 MPa, thus packaging the lead frame assembly 704. Hereinafter the shape of such a lead frame assembly 704, on which an electronic component such as the sensor element 701 has been mounted, just after packaging, is called a package assembly 602.

At this time, if the injection pressure of the resin part 601 is too high, the Au wire 504 will be washed away by the resin part 601 and will fall, and the Au wire 504 may come into contact with the cover frame 401. When the cover frame 401 is made of a metal material, short-circuit occurs at the Au wire 504, and the sensor element 701 and the outer lead 305 may not be electrically connected correctly.

To avoid this, the cover frame 401 may be made of a material not a metal only but silicon or glass. In the case of silicon or glass used, the communication groove 402 and the through hole 403 may be formed by wet etching, dry etching or blasting. Such a configuration including silicon or glass may be applicable to all cover frames 401 in the below-described embodiments.

Cutting the tie bar 304 of the package assembly 602, a part connecting the outer leads 305 of the tie bar 304 and the leading end of the outer lead 305 completes the chip package 203 of FIGS. 4(a)-(c) as described above. At this time, the outer lead 305 particularly has to be cut at its cutting line 1101. The outer lead may be cut at the cutting line 1101 so as to surely include the communication groove 402, whereby the opening 708 of the communication hole can be obtained as in FIGS. 4(b)-(c) as described above.

As stated above, the chip package 203, the housing member 201 and the cover member 202 define the sub-passage 101 and the circuit chamber 102, and so air inside the cavity 703 below the diaphragm flows through the communication hole 705, the circuit chamber 102 and the ventilation hole 108 to communicate with the atmosphere 109 outside of the intake pipe through the connector part 103.

Packaging of the sensor element 701 by such manufacturing procedure and to have such a configuration allows the space below the diaphragm to be cut off from the interior of the intake pipe 140, and so concern about water droplet and contaminations to reach there can be removed. Further, the cavity 703 below the diaphragm and the circuit chamber 102 can communicate with each other without adding any step to a typical packaging technique conventionally conducted. Since the cavity 703 below the diaphragm communicates with the atmosphere, deformation of the diaphragm 702 can be reduced, which is due to a pressure difference between the surface side and the rear face side of the diaphragm, and so a change in values of resistance of resistors making up the flow detection part 4 on the diaphragm 702 due to Piezoresistive effect can be reduced, and a change in characteristics of the thermal flow meter 100 can be reduced. Clogging of the opening leading to the space at the rear face of the diaphragm also can be prevented, and so a reliable product can be manufactured.

A ventilation hole that is provided at the sensor element for communication between the space at the rear face of the diaphragm and the exterior of the intake pipe will not be clogged, and the sensor element can be manufactured while suppressing variations in mounting.

Although the present embodiment illustrates the example providing a communication hole in the lead frame, including the below-described embodiments, the present invention is intended to provide a communication hole in a member to support the sensor element. That is, the present invention is not limited to these embodiments, and a communication hole may be provided at a substrate making up a circuit pattern, for example.

Embodiment 2

Figure 9:
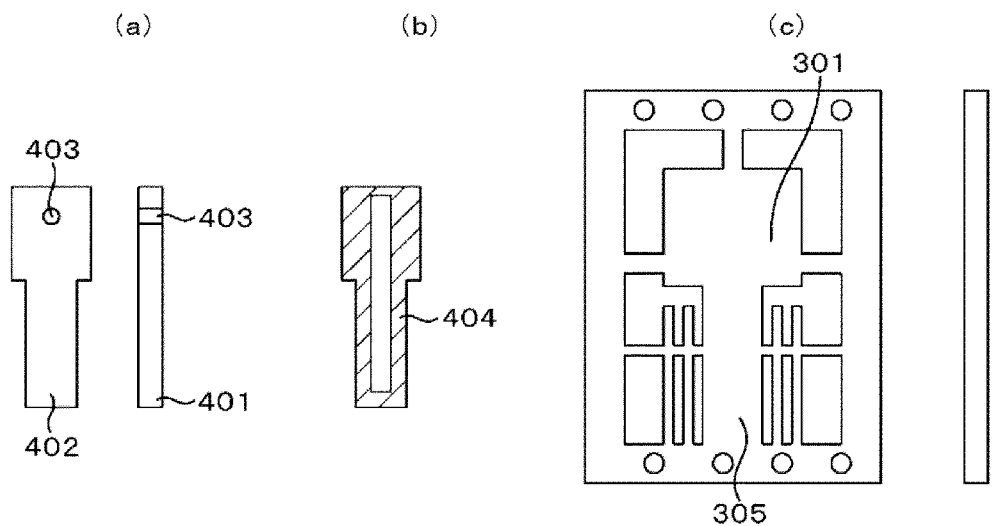
FIG. 9 includes a plan view and a cross sectional view (1) illustrating the shapes of a cover frame, adhesive and a lead frame that are components of a lead frame assembly that is Embodiment 2, which is one alternative proposal for Embodiment 1.

Referring to FIG. 9, the following describes a cover frame 401, a lead frame 301 and the shape to apply adhesive 404 that is another proposal for Embodiment 1.

Embodiment 1 requires half etching or pressing to form the communication groove 402 at the cover frame 401. The present embodiment is a method to simply the manufacturing process of a chip package by eliminating such a step. As illustrated in FIG. 9(b), paste-like adhesive 404 is applied by dispensing so as to surround the range including a through hole 403 and an outer lead 305, or sheet-like adhesive is cut and attached, whereby a communication hole 705 can be formed. This can manufacture the chip package 203 with a smaller number of steps than that of Embodiment 1.

Embodiment 3

Figure 10:
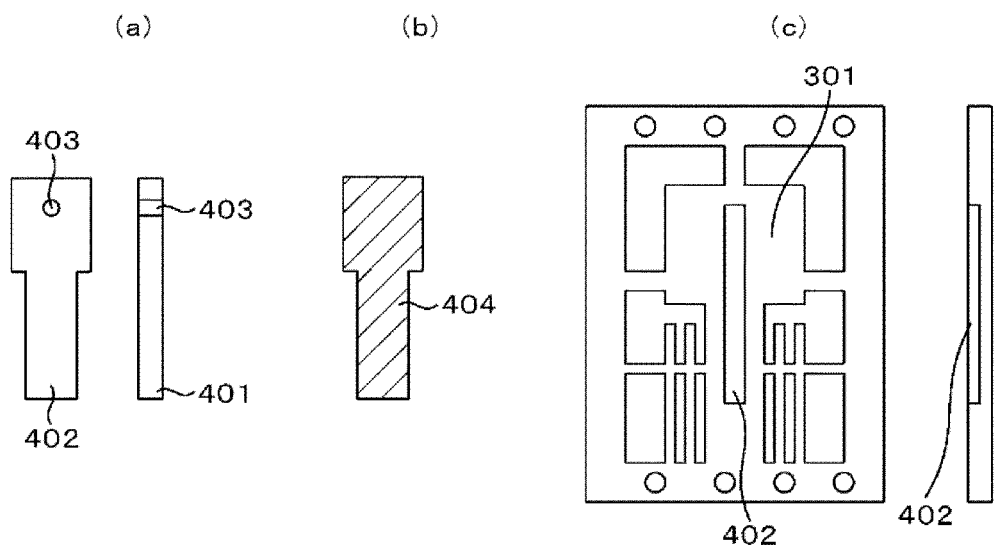
FIG. 10 includes a plan view and a cross sectional view (2) illustrating the shapes of a cover frame, adhesive and a lead frame that are components of a lead frame assembly that is Embodiment 3, which is another alternative proposal for Embodiment 1.

Referring to FIGS. 10(a)(b) and (c), the following describes a still another proposal for a cover frame 401, a lead frame 301 and the shape to apply adhesive 404 to mount a sensor element 701 on a lead frame assembly 704 more precisely than Embodiment 1.

The communication groove 402 disposed at the cover frame 401 makes the wall thickness of the cover frame 401 nonuniform, and so there is a concern to degrade flatness of the plane on which a sensor element 701 is to be mounted. The communication groove 402 disposed at the lead frame 301 then leads to a concern to degrade the flatness similarly to the case of the cover frame. The communication groove 402 may be disposed at the lead frame 301, and degradation in flatness of the lead frame 301 may be accommodated with the adhesive 404.

From the viewpoint of the accuracy in height to mount the sensor element 701, the adhesive 404 may be applied using sheet adhesive instead of applying on the lead frame by dispensing to suppress variations in dimensions in the lamination direction. However, it is difficult to cut it into the shape surrounding the cavity as in the application area of the adhesive 404 illustrated in FIG. 9(b), and so adhesive 404 that is made of a porous material that transmits not resin but air is preferably used. The present embodiment enables the lead frame assembly 704, on which the sensor element 701 can be mounted more precisely.

Embodiment 4

Figure 8:
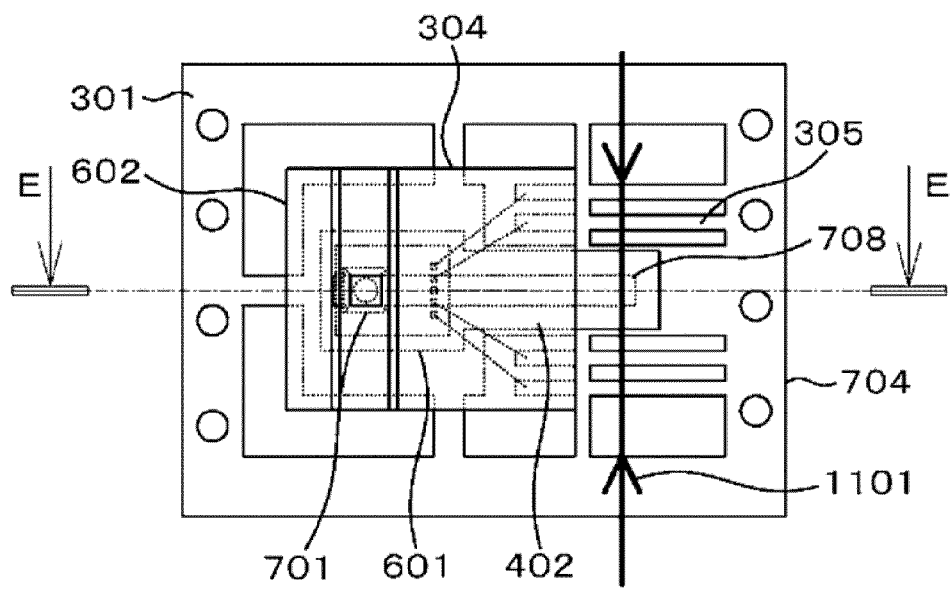
FIG. 8 includes a plan view and a cross sectional view illustrating a step of Embodiment 1 after transfer molding.
Figure 8:
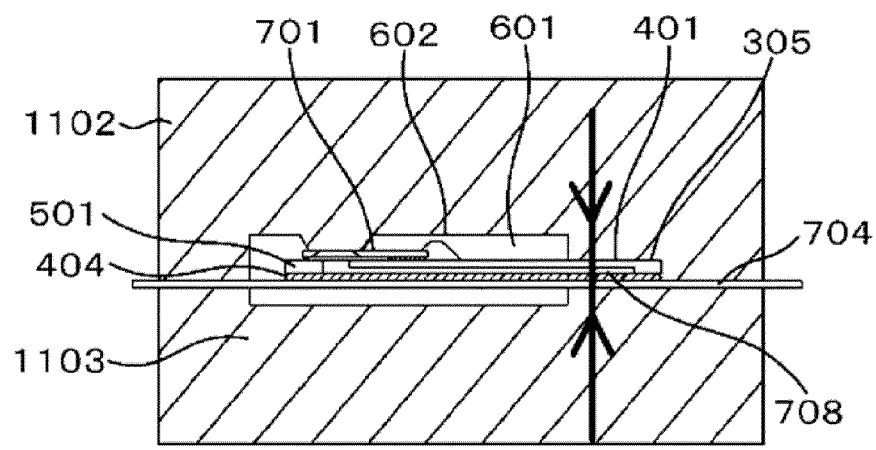

Referring to FIG. 8, the following describes the transfer molding processing of Embodiment 1 again. The outer lead 305 and the tie bar 304 protrude from the resin part 601 of the chip package 203 to the outside, and so the upper mold for transfer molding 1102 and the lower mold for transfer molding 1103 are manufactured to avoid the outer lead 305 and the tie bar 304.

As a result, if the cover frame 401 is displaced on the lead frame 301 from a predetermined shape during mounting, there occurs a gap between the outer lead 305, which is formed by overlapping of the lead frame 301 and the cover frame 401, and the mold, and then the resin part 601 flows out from this gap. This results in incorrect shape of the chip package 203. In order to prevent the leakage of resin during transfer molding, the dimension of the gap has to be about 5/1,000 mm, and so very high accuracy is required to mount the cover frame 401 on the lead frame 301.

Figure 11:
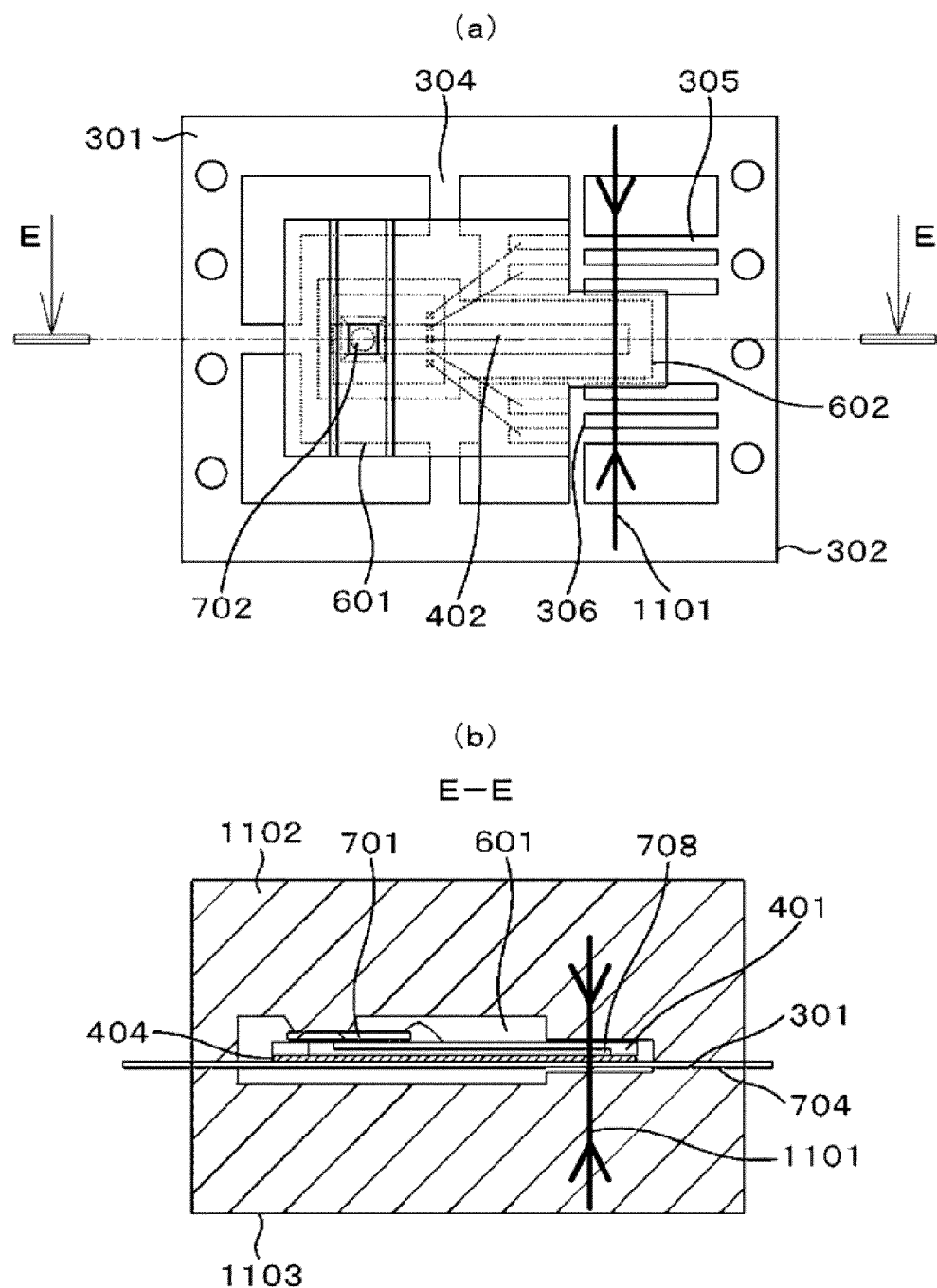
FIG. 11 illustrates Embodiment 4, illustrating a cutting part of an outer lead including a communication hole.

Referring to FIG. 11, the following describes the structure and the manufacturing method to relax restrictions on such an allowable gap dimension. The basic components, structure and manufacturing steps are the same as those of Embodiments 1 to 3.

When the lead frame 301 and the cover frame 401 are bonded with the adhesive 404, the communication groove 402, which is formed in any Embodiments 1 to 3, is formed so as to define a closed space inside the cover frame 401. Next, when the lead frame assembly 704 is molded, the package assembly 602 is formed so as to make sure that the molding range of the resin part 601 is within the range including the entire cover frame 401, and then when the package assembly 602 is cut out from the outer frame 302, cutting is performed at the cutting line 1101 of FIG. 11 in the cover frame 401. Herein, the cutting line 1101 is set so as to pass through a part of the closed space of the adhesion groove. This forms the opening 708 of the communication hole.

This structure prevents the leakage of resin to the outside as long as the upper mold for transfer molding 1102 and the lower mold for transfer molding 1103 cover the range including the communication groove 402 while having the width of about ±0.2 mm at the periphery of the part of the cover frame 401 making up the outer lead 305, even when there is a displacement of about ±0.1 mm, for example, of the cover frame 401 relative to the lead frame 301 during adhesion, and so the chip package 203 formed can have a correct shape.

Embodiment 5

Figure 12:
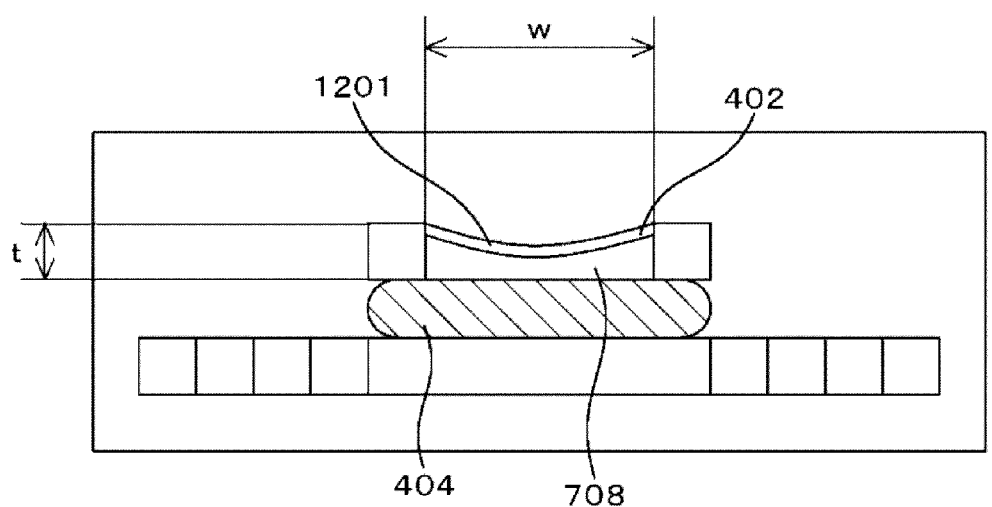
FIG. 12 is an enlarged view of a cut end of an outer lead cutting part including a communication hole.

FIG. 12 illustrates the opening 708 of the communication hole that is obtained after cutting of the outer lead 305.

In Embodiment 1 or Embodiment 3, when the outer lead 305 is cut after preparing the package assembly 602, a punch for cutting may crush the upper side face 1201 of the communication hole when pushing the outer lead 305 for cutting, which may block the communication hole 705.

Let that t denotes the wall thickness of the lead frame and w denotes the width of the communication hole, a part of the communication hole passing through the cutting line 1101 desirably has a relationship of the width of communication hole w≤the wall thickness t.

Embodiment 6

Figure 13:
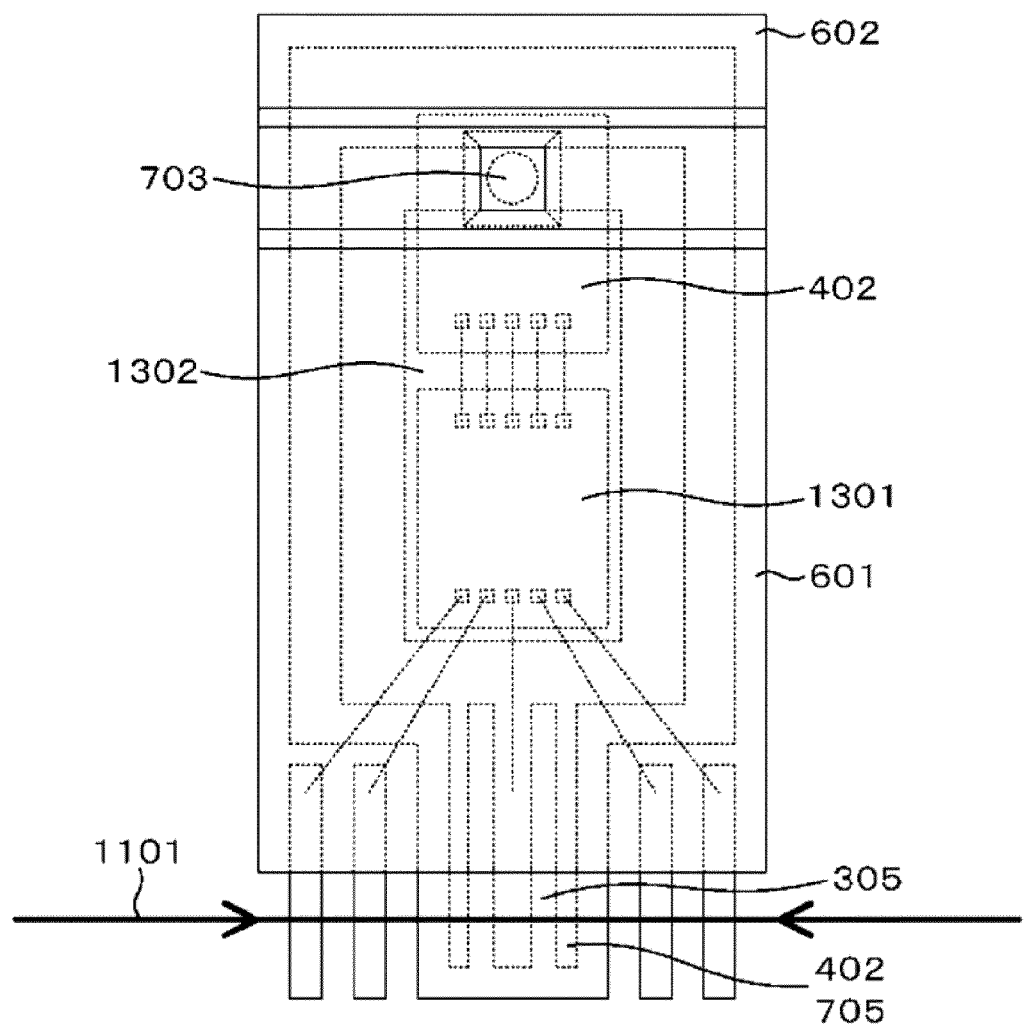
FIG. 13 illustrates an alternative proposal to mount a plurality of chips and an alternative proposal to improve the connection reliability at a cutting part.
Figure 13:
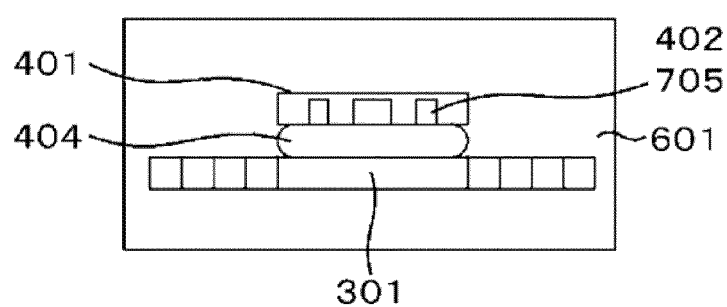
Figure 14:
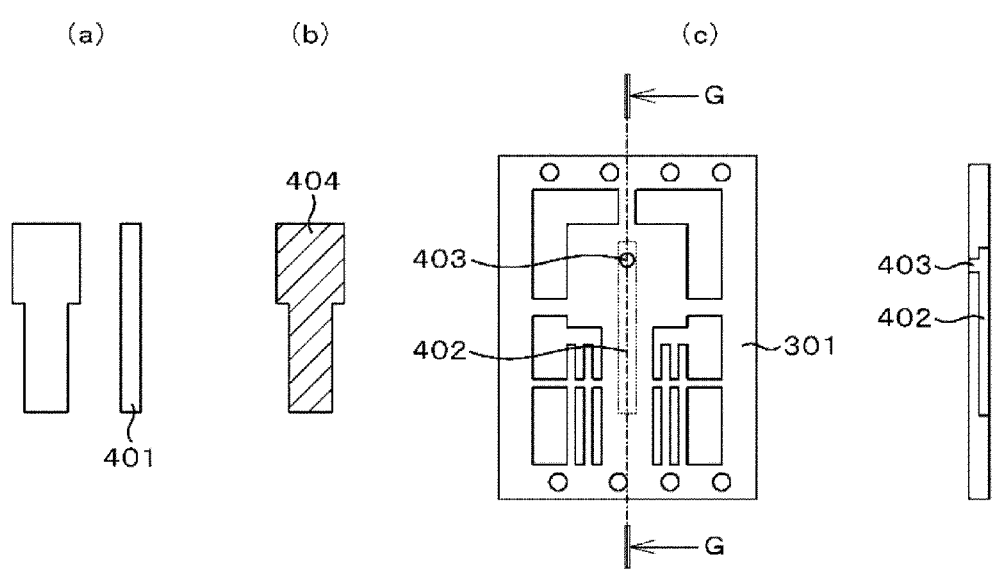
FIG. 14 includes a plan view and a cross sectional view illustrating the shapes of a cover frame, adhesive and a lead frame that are components of a lead frame assembly that is Embodiment 8.

FIG. 13(a) illustrates an alternative proposal for Embodiment 5 including the package assembly 602 without the outer frame 302, and FIG. 13(b) illustrates the state of the opening 708 of the communication hole after cutting the outer lead 305 at the cutting line 1101.

As illustrated in FIG. 13(b), a plurality of communication grooves 402 provided can increase the total area of the opening 708 of the communication hole, whereby reliability of the connection between the cavity 703 at the rear face of the diaphragm and the opening 708 of the communication hole via the communication hole 705 can be improved.

Embodiment 7

In Embodiments 1 to 6, the chip component to be mounted on the cover frame 401 is not limited to the sensor element 701 only. The present embodiment illustrates the example where a plurality of chip components including a sensor element is mounted on the cover frame 401. Referring again to FIG. 13(a), the following describes the form to mount a plurality of chips.

When a chip 1301 including an arithmetic circuit, for example, in addition to the sensor element 701, is mounted on a first lead frame, the minimum area of the first lead frame will be increased by the area of the chip 1301 at least.

The present embodiment can be manufactured by the same manufacturing procedure and with the structure of the components and the components used as those of Embodiment 1. However, in the case of a broader communication groove 402, the cover frame 401 may be deformed due to the injection pressure of thermosetting resin, so that the state of the sensor element 701 and the chip 1301 mounted becomes instable and variations in dimensions to mount chip components in the lamination direction may increase.

Then, a part 1302 free from the communication hole 705 is desirably disposed at an area immediately below the sensor element 701 or the chip 1301, such an area being disposed partially or entirely on the rear face side of the chip 1301.

Embodiment 8

Referring again to FIG. 2 that is a cross sectional view of the thermal flow meter, the following describes a method to improve the accuracy in position to mount the sensor element 701 to reduce variations in characteristics of the thermal flow meter 100.

The positional accuracy of the sensor element 701 in the sub-passage 101 of the thermal flow meter 100 affects the variations in characteristics of the thermal flow meter 100. The chip package 203 is bonded to the housing member 201 and the cover member 202 that make up the sub-passage 101. This means that, in order to mount the sensor element 701 in the sub-passage 101 precisely, variations in dimensions between the surface of the resin part 601 and the surface of the sensor element 701 that is at the bonding face with the housing member 201 and the cover member 202 have to be minimized.

Referring next to FIG. 8(b), the following considers the integration of variations in dimensions inside the chip package 203. The positional relationship between the sensor element 701 and the resin part 601 depends on the transfer molding step. At this time, since the lead frame 301 is set to be sandwiched between the upper mold for transfer molding 1102 and the lower mold for transfer molding, the lead frame surface will serve as a reference for the dimensional tolerance.

This means that factors of variations in dimensions between the surface of the resin part 601 and the sensor element 701 in the lamination direction during mounting include the flatness of the face to mount the lead frame 301 thereon, variations in thickness of the adhesive 404, variations in thickness of the cover frame 401, flatness of the bonding face between the cover frame 401 and the lead frame 301, flatness of the face of the cover frame 401 to mount the sensor element 701 thereon, and variations in thickness of the die-bond material 501.

In the present embodiment, the cover frame 401 is bonded to the opposite side of Embodiment 1 to alleviate the factors of variations in the lamination direction of the sensor element 701 during mounting, and the die-bond material 501 is directly applied to the lead frame 301, followed by mounting of the sensor element 701. This can reduce the factors of variations in the lamination direction of the sensor element 701 during mounting to the flatness of the face to mount the lead frame 301 thereon and the variations in thickness of the die-bond material 501 only. The following describes the manufacturing procedure, the components included and the structure of the components with reference to FIGS. 14 to 19.

Firstly, similarly to Embodiment 1, the lead frame 301 and the cover frame 401 are prepared (in the present embodiment, the aforementioned first lead frame and second lead frame are called a lead frame and a cover frame, respectively). FIG. 14(a) describes the structure of the lead frame, FIG. 14(b) describes the shape of the lead frame and the adhesive 404 to bond the cover frame 401 and the lead frame 301, and FIG. 14(c) describes the structure of the cover frame 401.

The lead frame 301 includes a through hole 403 that is disposed immediately below a cavity 703 under the diaphragm of the sensor element 701, a communication groove 402 to release air from the cavity 703 below the diaphragm, which is formed by etching or pressing, an outer frame 302, a die pad 303 to mount an electronic component such as a sensor element 701 thereon, a tie bar 304 to joint the outer frame to the die pad 303 so as not to cause displacement of these components due to influences from resin flow during transfer molding, and an outer lead 305 to serve as a terminal of the chip package 203. This structure is preferable because it enables a simple configuration just by cutting the outer peripheral shape surrounding the communication groove 402 to process a cover frame 401.

Figure 15:
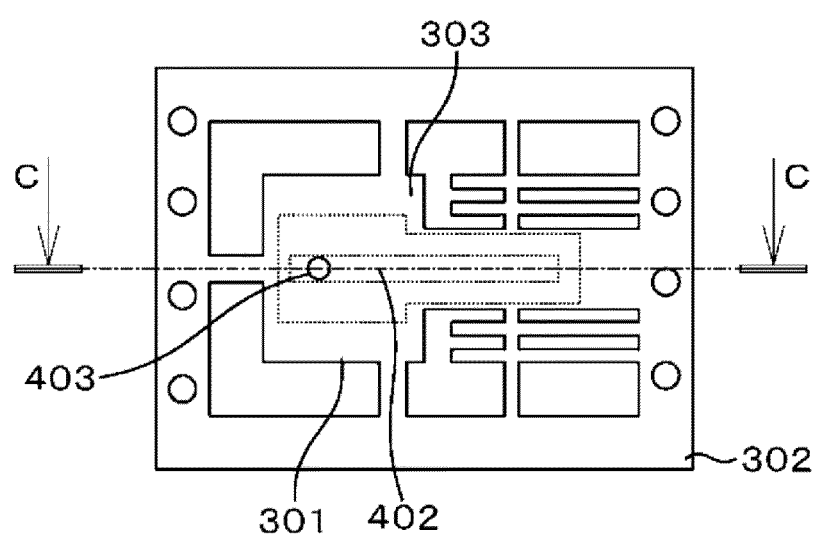
FIG. 15 includes a plan view and a cross sectional view illustrating a step of Embodiment 8 in the state where a cover frame is mounted.
Figure 15:
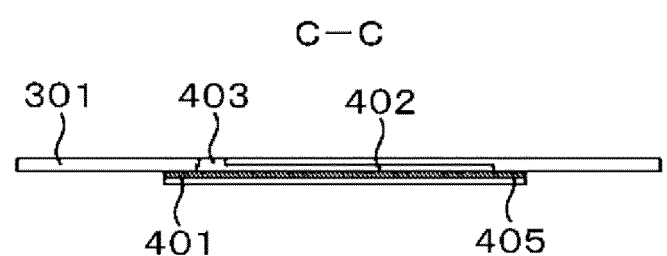

FIG. 15 illustrates the state where the lead frame 301 and the cover frame 401 are bonded with the adhesive 404.

The adhesive 404 is applied at an area between the lead frame 301 and the cover frame 401 and surrounding an adhesion groove 405. At this time, since there is no need to provide an internal range of the application of the adhesive 404 where the adhesive 404 is not to be applied, sheet-form adhesive 404 is used preferably, whereby the step can be very simple.

Figure 16:
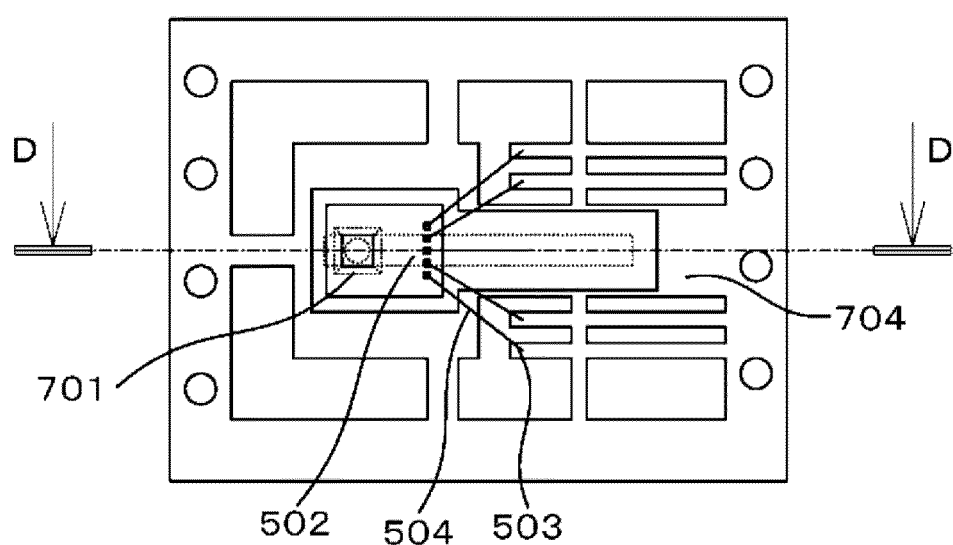
FIG. 16 includes a plan view and a cross sectional view illustrating a step of Embodiment 8 in the state where a sensor element is mounted at a lead frame assembly.
Figure 16:
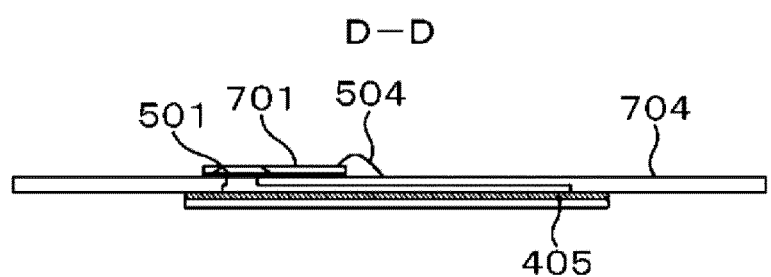

FIG. 16 illustrates the state where the sensor element 701 is structurally or electrically bonded to the lead frame assembly 704, where FIG. 16(a) is a front view and FIG. 16(b) is a cross sectional view.

A die-bond material 501 that is Ag paste or epoxy-based material is applied on the lead frame 301 so as to surround the through hole, and then sensor element 701 is die-bonded, followed by heating of the die-bond material 501 and the adhesive 404 for curing.

Subsequently, an electrode extraction part 42 on the sensor element 701 and a bonding part 503 on the lead frame 301 are connected by wire bonding using Au wire 504.

The subsequent steps to prepare the chip package 203 are the same as those in Embodiment 1.

Packaging of the sensor element 701 with such structure, components included, manufacturing procedure similarly to Embodiment 1 allows the cavity 703 below the diaphragm to be cut off from the interior of the intake pipe 140, and so concern about water droplet and contamination to reach there can be removed. Further, the space below the diaphragm and the atmosphere can communicate with each other, whereby a concern about the deformation of the diaphragm 702 can be removed, which is due to a pressure difference between the surface side and the rear face side of the diaphragm, and so a change in values of resistance due to Piezoresistive effect, i.e., a change in characteristics can be reduced.

Further, the sensor element 701 can be packaged precisely, which can contribute to suppress variations in characteristics of the thermal flow meter 100.

Embodiments 5, 6 and 7 may be combined, whereby needless to say, a chip package can be manufactured more precisely.

Embodiment 9

Figure 17:
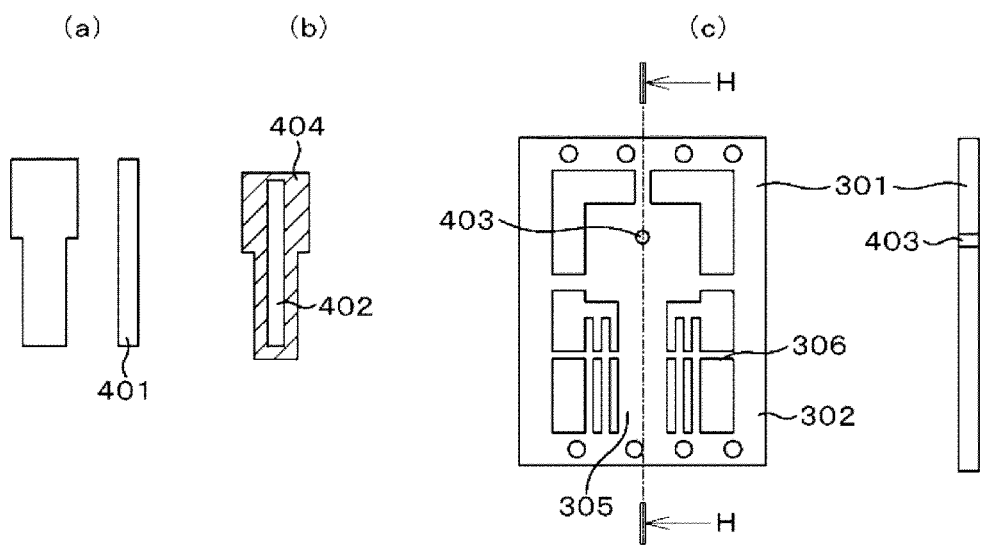
FIG. 17 includes a plan view and a cross sectional view (1) illustrating the shapes of a cover frame, adhesive and a lead frame that are components of a lead frame assembly that is Embodiment 9, which is one alternative proposal for Embodiment 1.

Referring to FIGS. 17(*a*) (*b*) and (*c*), the following describes a cover frame 401, a lead frame 301 and the shape to apply adhesive 404 in Embodiment 9. Embodiment 8 requires etching or pressing at the cover frame 401 to form the components making up the lead frame assembly 704. The present embodiment can eliminate such a step, whereby the manufacturing process of a chip package 203 can be simplified.

As illustrated in FIG. 17(*b*), adhesive 404 is applied so as to surround the range including a through hole 403 and an outer lead 305, whereby a communication hole 705 can be formed. This can manufacture the chip package 203 with a smaller number of steps than that of Embodiment 8.

Embodiment 10

Figure 18:
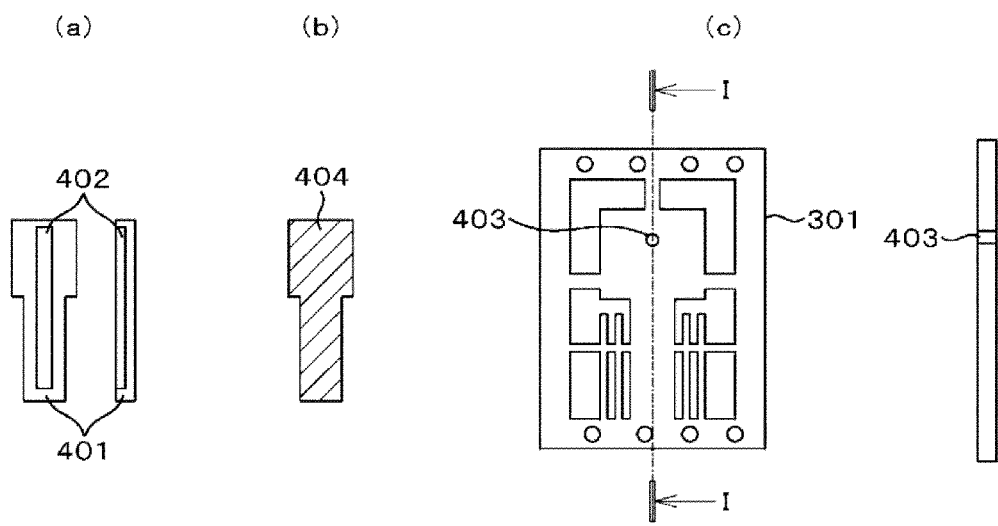
FIG. 18 includes a plan view and a cross sectional view (2) illustrating the shapes of a cover frame, adhesive and a lead frame that are components of a lead frame assembly that is Embodiment 10, which is another alternative proposal for Embodiment 1.

Referring to FIGS. 18(*a*)(*b*) and (*c*), the following describes a cover frame 401, a lead frame 301 and the shape to apply adhesive 404 in Embodiment 10.

The communication groove 402 disposed at the lead frame 301 in the above Embodiment 8 makes the wall thickness of the lead frame 301 nonuniform as illustrated in FIG. 16, and so there is a concern to degrade flatness of the plane on which a sensor element 701 is to be mounted.

Then, as illustrated in FIG. 18, the communication groove 402 of the present embodiment is disposed at the cover frame 401 to accommodate the degradation in flatness of the cover frame 401 with the adhesive 404.

Further, from the viewpoint of the accuracy in height to mount the sensor element 701, the adhesive 404 may be applied using sheet adhesive instead of applying on the lead frame by dispensing to suppress variations in dimensions in the height direction. However, it is difficult to cut it into the shape surrounding the cavity as in FIG. 14(*b*) using the sheet adhesive, a shape without a hole as in FIG. 18(*b*) is preferable.

Then the adhesive 404 that is made of a porous material that transmits not resin but air is preferably used.

Embodiment 11

Embodiments 1 to 10 describe the lead frame assembly 704 including the lead frame 301, the adhesive 404, the cover frame 401, the sensor element 701, the die-bond material 501 and the Au wire 504 as a minimum configuration, and the following describes the present embodiment as an alternative proposal that does not include the cover frame 401 to reduce the number of components. The basic steps are the same as those in Embodiment 1 and Embodiment 8.

FIGS. 19 to 22 illustrate the structure of a lead frame 301 in the present embodiment. In these drawings, (a) is a front view of the lead frame 301 and (b) is a cross-sectional view including the center of the through hole 403.

Figure 19:
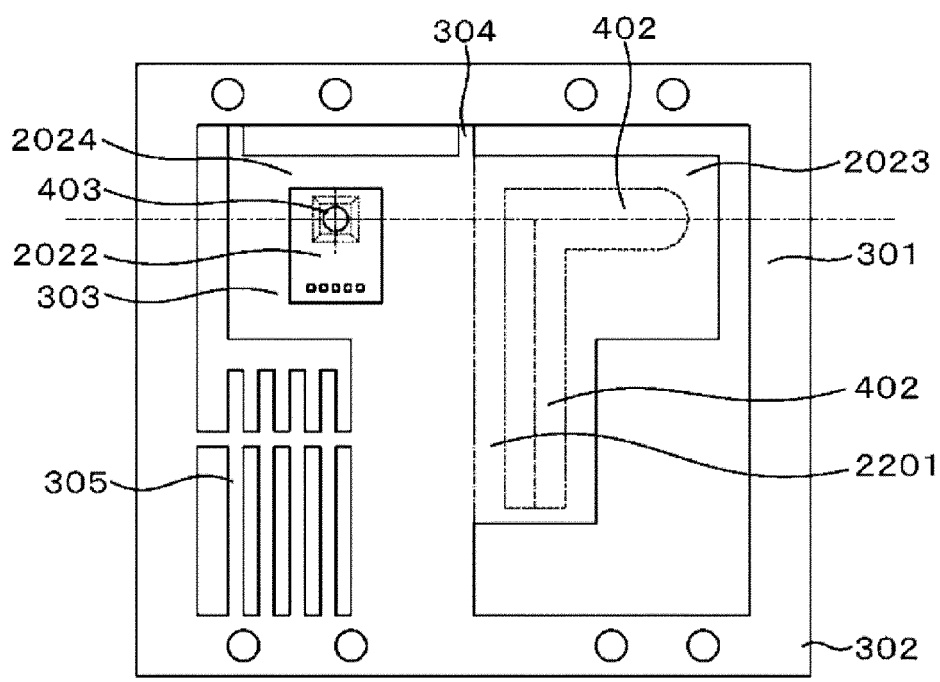
FIG. 19 illustrates an alternative proposal to form a communication groove by pressing by bending a lead frame that is Embodiment 11.
Figure 19:
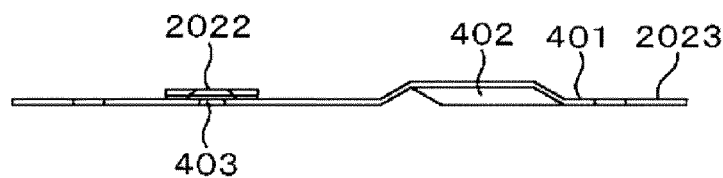
Figure 20:
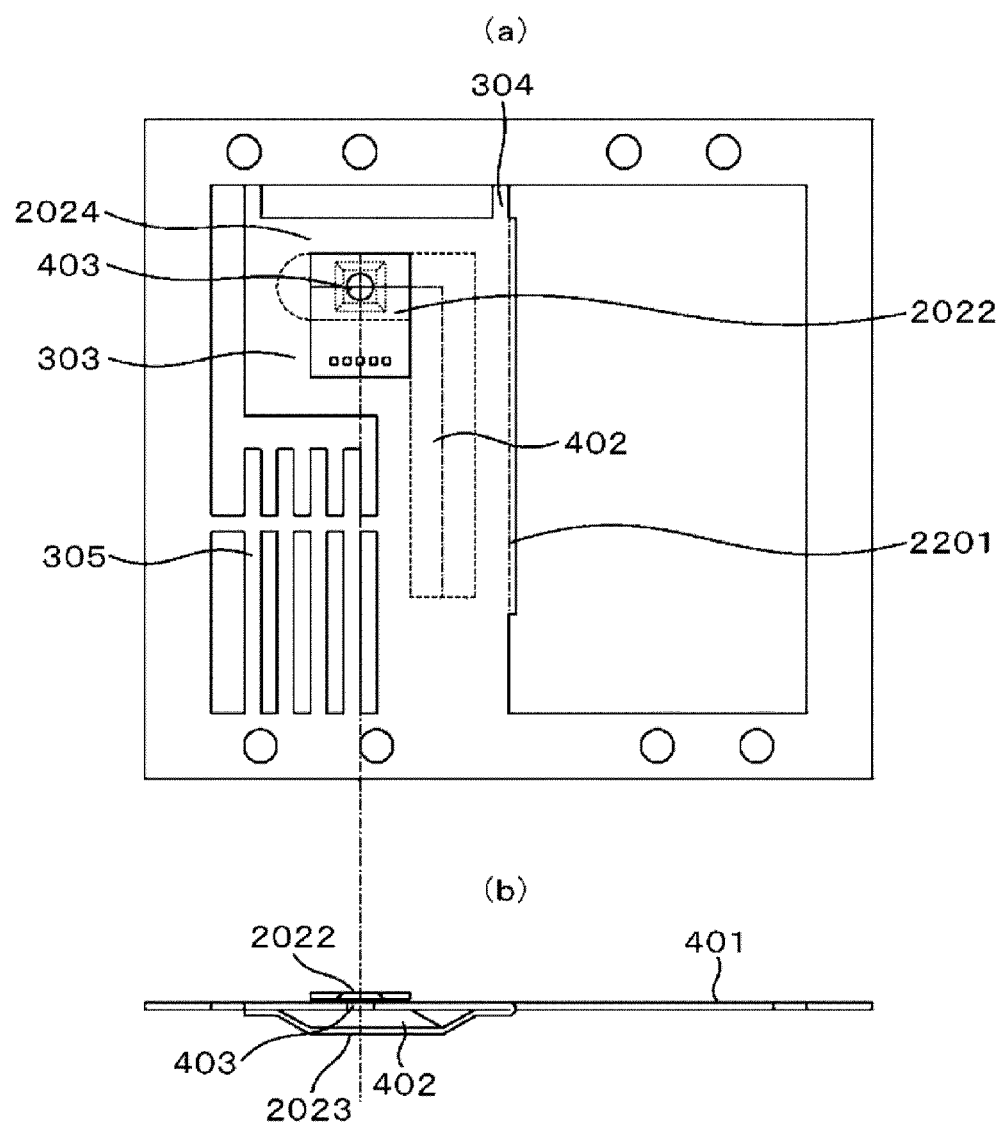
FIG. 20 illustrates the alternative proposal to form a communication groove by pressing by bending a lead frame that is Embodiment 11.

Firstly the lead frame 301 illustrated in FIG. 19 is prepared. Similarly to the aforementioned lead frame 301, the lead frame 301 includes the die pad 303, the tie bar 304, a dam bar 306, the outer lead 305 and the outer frame 302. Then, the entire lead frame 301 is divided into a main frame 2024 and a tab lead 2023 at a mountain folding line 2201 as the border, where the die pad 303, the tie bar 304, the through hole 403 in the range including at least a part of the cavity under the diaphragm when the sensor element 701 is mounted on the die pad 303, and the tab lead 2023 are disposed on the main frame 2024 side. On the tab lead 2023 side, the communication groove 402 is formed as a recess by pressing performed from the face on the opposite side of the sensor-element mounting face toward the sensor-element mounting plane, and the through hole 403 and the communication groove 402 are disposed to be overlapped each other when the lead frame is folded by 180 degrees along the mountain folding line 2201. Adhesive is then applied to the main frame 2024 side or the tab lead 2023 side so as to surround the communication groove 402 entirely, followed by bending of the lead frame along the mountain folding line 2201, whereby the tab lead 2023 and the main frame 2024 are bonded with the adhesive 404. The subsequent steps following the mounting of the sensor element 701 are the same as those in Embodiment 8, where the mountain folding line 2201 is used as a valley folding line, and a communication groove 402 is disposed at the main frame 2024 and a through hole 403 is bored at the tab lead 2023 similarly to Embodiment 8.

Considering the cover frame 401 in Embodiments 2 to 7 and Embodiment 9 to 10 as the tab lead 2023 for replacement, the members making up the communication groove 402 and the through hole 403 and the range to apply the adhesive 404 may have the same configuration, whereby the same advantageous effects from these embodiments can be achieved for the problems to be solved by the embodiments.

Figure 21:
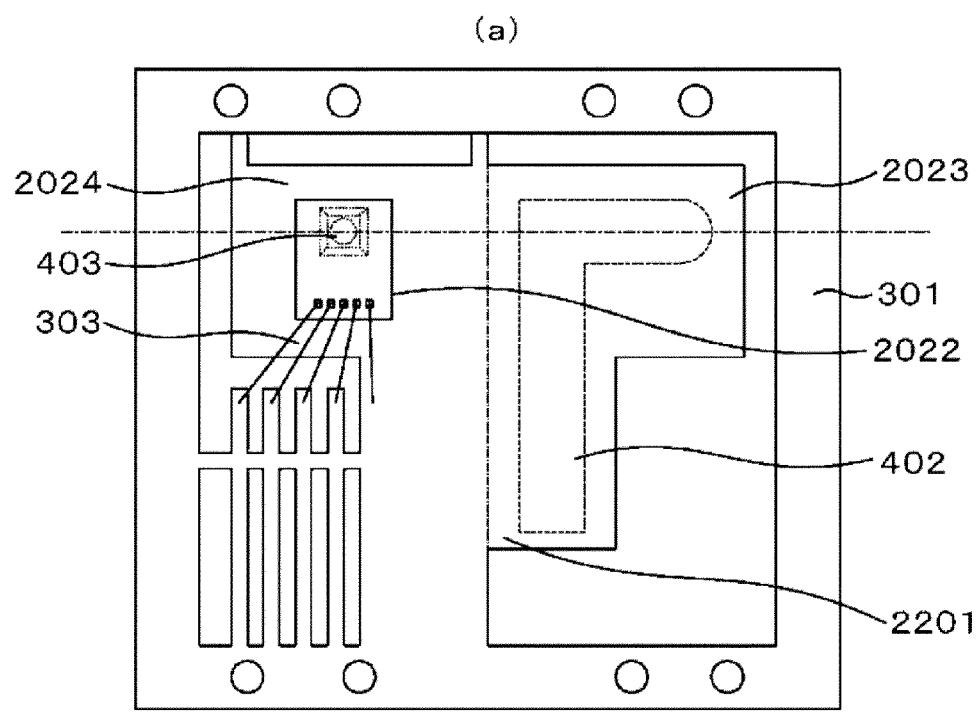
FIG. 21 illustrates another alternative proposal to form a communication groove by etching by bending a lead frame that is Embodiment 11.
Figure 21:
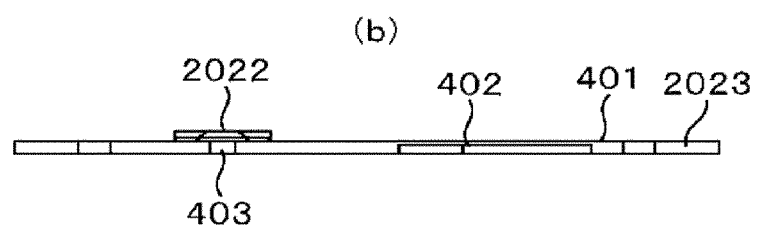
Figure 22:
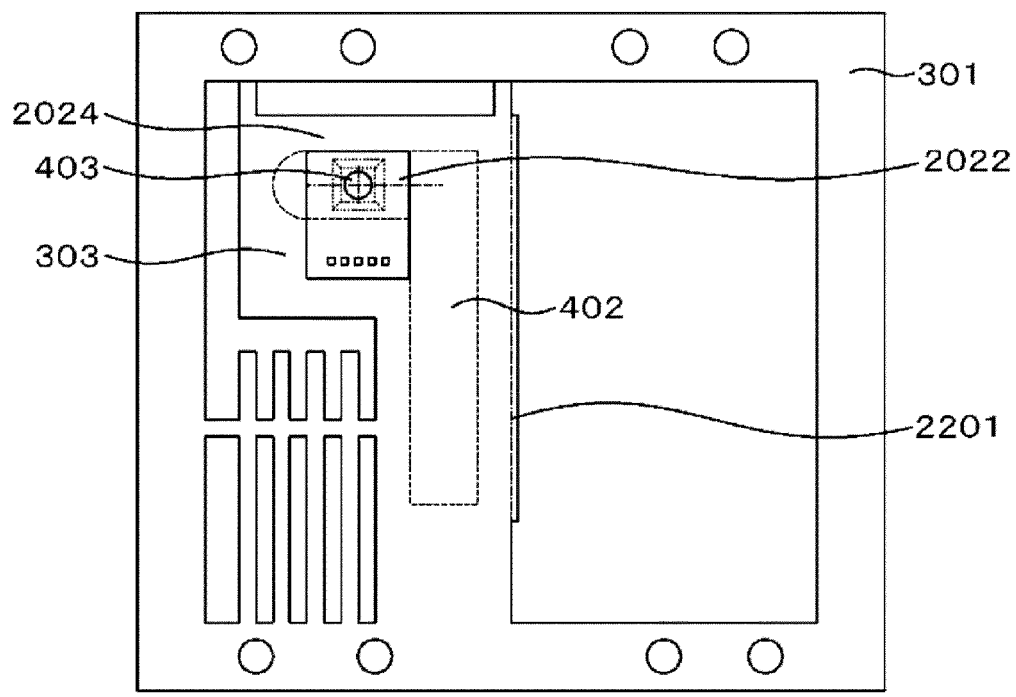
FIG. 22 illustrates the alternative proposal to form a communication groove by etching by bending a lead frame that is Embodiment 11.
Figure 22:
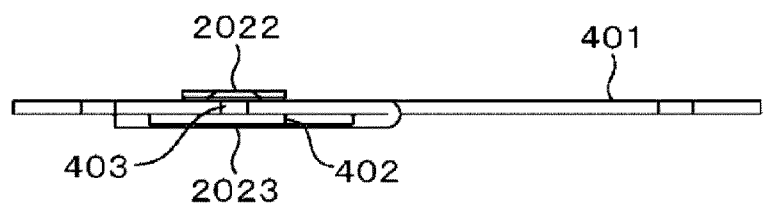

FIGS. 21 and 22 illustrate an example where the communication groove 402 of the present embodiment is formed by half etching, from which the same advantageous effects can be obtained similarly.

Embodiment 12

In Embodiments 1 to 11, when cutting out the chip package 203 and the outer lead 305 from the outer frame 302 of the package assembly 602, the outer lead 305 making up the communication hole 705 is disconnected, whereby the opening 708 of the communication hole is formed. However, when disconnecting the outer lead 305 to make up the communication hole 705, there is a concern to crush the communication hole 705 with a punch for disconnection, thus blocking the opening 708 of the communication hole. To avoid this concern, the present embodiment proposes another method to form the opening 708 of the communication hole by way of a typical example of the manufacturing procedure and the structure illustrated in FIG. 1, with reference to FIGS. 23 to 26.

Firstly a lead frame 301 and a cover frame 401 are prepared. The lead frame 301 has the same configuration as that of the lead frame in the aforementioned Embodiment 1.

Figure 23:
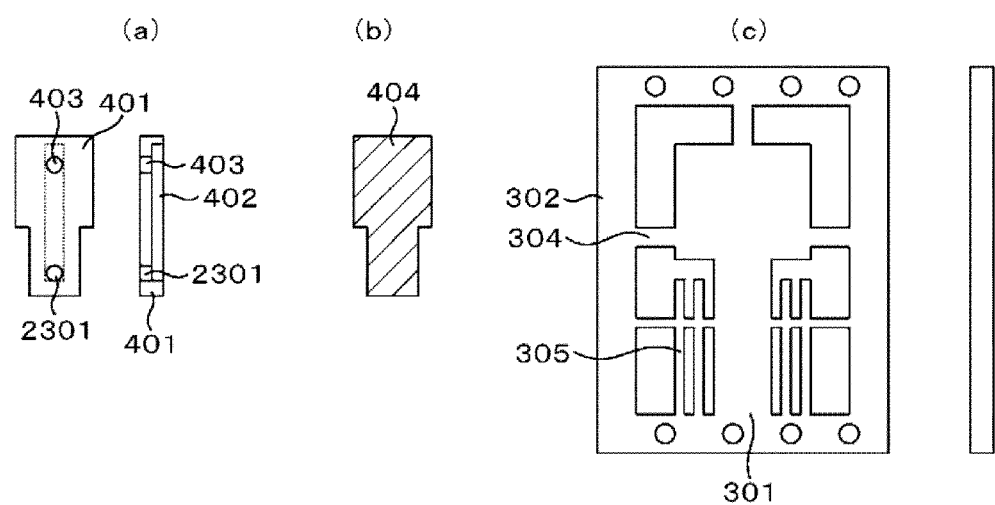
FIG. 23 includes a plan view and a cross sectional view illustrating the shapes of a cover frame, adhesive and a lead frame that are components of a lead frame assembly that is Embodiment 12.

Referring to FIG. 23(*a*), the configuration of the cover frame 401 is described below. To release air from the cavity 703 below the diaphragm, the cover frame 401 includes a through hole 403 disposed immediately below the diaphragm, a communication groove 402 that is formed by half etching or pressing, and at least one or a plurality of lead frame openings 2301 to connect the communication groove 402 and the sensor-element mounting face.

Figure 24:
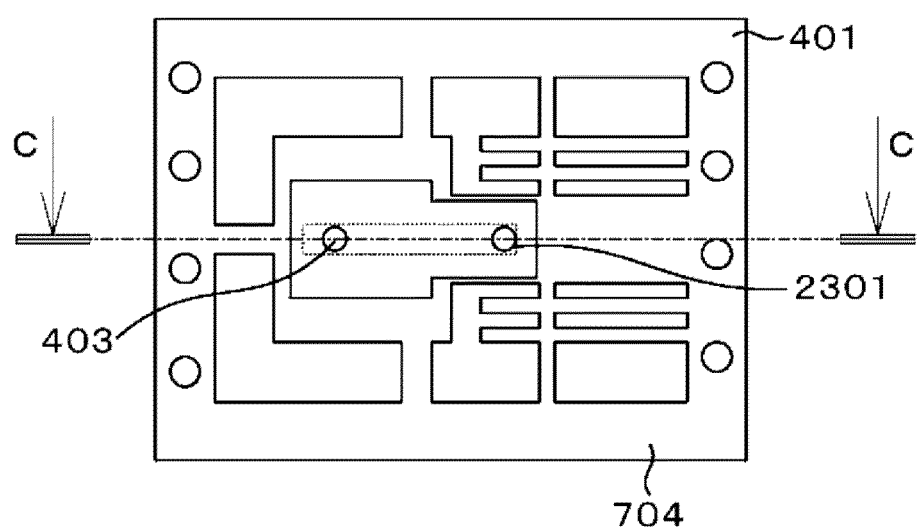
FIG. 24 includes a plan view and a cross sectional view illustrating a step of Embodiment 12 in the state where a cover frame is mounted.
Figure 24:
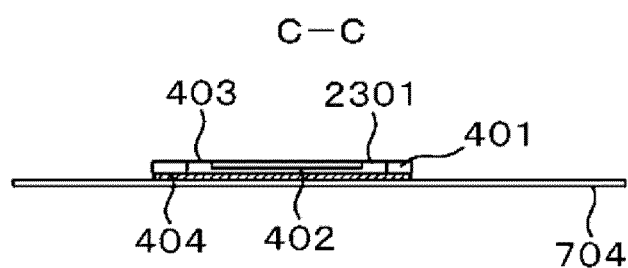
Figure 25:
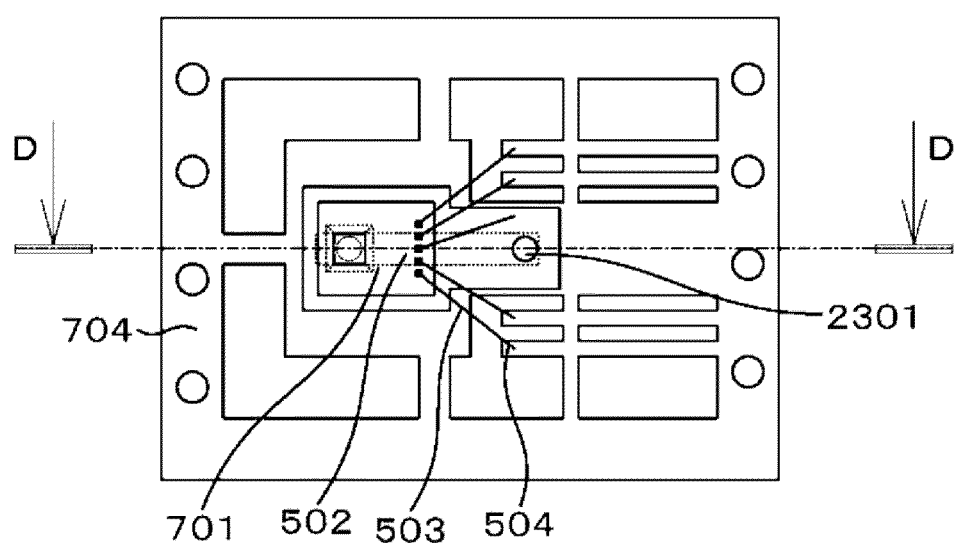
FIG. 25 includes a plan view and a cross sectional view illustrating a step of Embodiment 12 in the state where a sensor element is mounted at a lead frame assembly.
Figure 25:
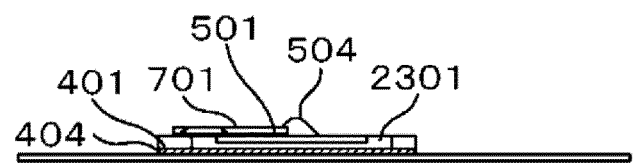

FIG. 24(*a*) is a front view illustrating the state where the lead frame 301 and the cover frame 401 are bonded with adhesive 404, and FIG. 24(*b*) is a cross-sectional view thereof. When the lead frame 301 and the cover frame 401 are bonded with the adhesive 404, the communication groove 402 leading to the through hole 403 is formed.

FIG. 25(a) is a front view illustrating the state where the sensor element 701 is structurally or electrically bonded to the lead frame assembly 704, and FIG. 25(b) is a cross sectional view thereof.

After applying a die-bond material 501 made of Ag paste or thermosetting adhesive so as to surround the through hole on the cover frame 401, the sensor element 701 is die-bonded, and the die-bond material and the adhesive are heated in an oven for curing.

Then, an electrode extraction part 42 on the sensor element 701 and a bonding part 503 on the lead frame are connected by wire bonding using Au wire 504.

Figure 26:
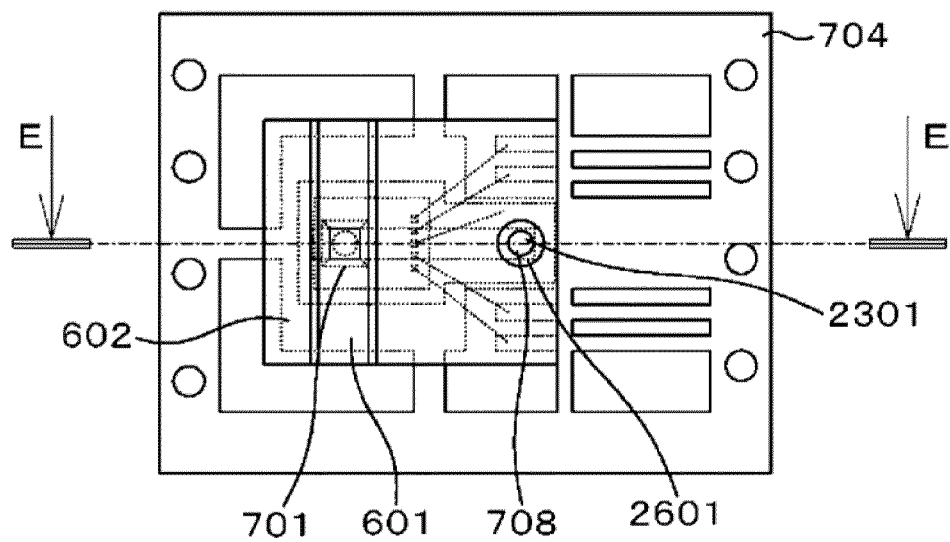
FIG. 26 illustrates a step of Embodiment 12, including a plan view after transfer molding and a cross sectional view illustrating the state where a lead frame is pressed with a mold during transfer molding.
Figure 26:
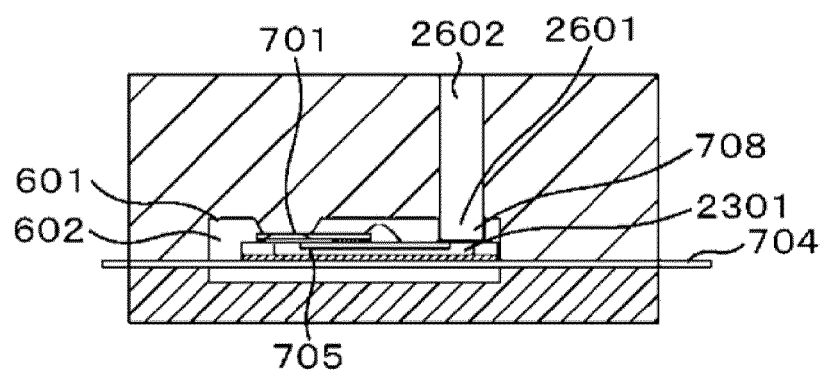

FIG. 26 illustrates the state where molding is performed for the lead frame assembly 704 on which the sensor element 701 has been mounted.

The lead frame assembly 704 on which the sensor element 701 has been mounted, which is prepared by the procedure till FIG. 26 as stated above, is set in a mold for transfer molding, and resin such as epoxy or polyamide is poured into the mold by transfer molding, thus forming a package assembly 602. At this time, an opening 2301 of the lead frame is covered with a pin 2602 that is larger than the opening 2301. This can prevent the transfer molding resin from flowing into the communication hole 705, and the place covered with the pin 2602 becomes a package opening 2601 after releasing of the mold for transfer molding, and the combination of the opening 2301 of the lead frame and the package opening 2601 forms an opening 708 of the communication hole of the package assembly 602. The subsequent manufacturing procedure to prepare the chip package 203 is the same as those in Embodiment 1.

Such manufacturing procedure and configuration can form the opening 708 of the communication hole without cutting the outer lead 305 making up the communication hole 705, thereby removing a concern to block the communication hole during disconnection of the outer lead 305.

The present embodiment can be applied to Embodiments 2 and 3 as well as Embodiments 7 to 11, from each of which the same advantageous effects can be obtained.

Embodiment 13

Figure 27:
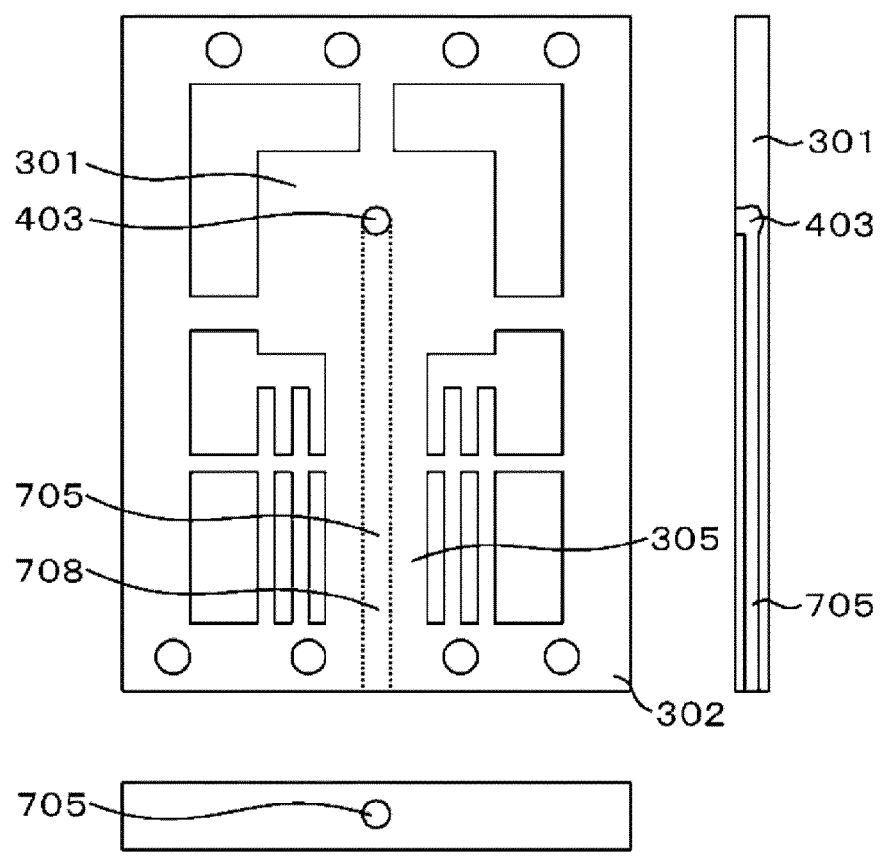
FIG. 27 illustrates a method that is Embodiment 13 to form a communication hole at a lead frame by additional processing.

Referring to FIG. 27, Embodiment 13 is described below. The present embodiment includes additional processing performed to the lead frame 301 so as to form a communication hole 705 and a through hole 403. When the wall thickness of a material for the lead frame is sufficiently thick of 2 mm or more, for example, a hole can be bored there in the thickness direction using a drill of about $\phi$ 1 mm.

A horizontal hole vertical to the face on which the sensor element 701 is to be mounted is bored at a die pad to be a through hole 403. Another horizontal hole is bored from the outside of the outer frame 302 so as to intersect the through hole 403 and penetrate through the outer lead 305 in the direction parallel to the sensor-element 701 mounting face to be a communication hole 705. The thus prepared lead frame 301 is a lead frame 704, and a chip package 203 is manufactured by the same steps as those in Embodiment 1.

The present embodiment can reduce the number of components as compared with Embodiments 1, 8 and 11, and the lead frame assembly can be formed of materials having minimum sizes. As compared with the case of bonding lead frames or separate members to form a communication hole as in Embodiments 1 to 11, there is no concern to block the communication hole 705 during transfer molding or during cutting of the outer lead, and so reliability of the connection between the cavity 703 below the diaphragm and the opening 708 of the communication hole can be improved.

Embodiment 14

Figure 28:
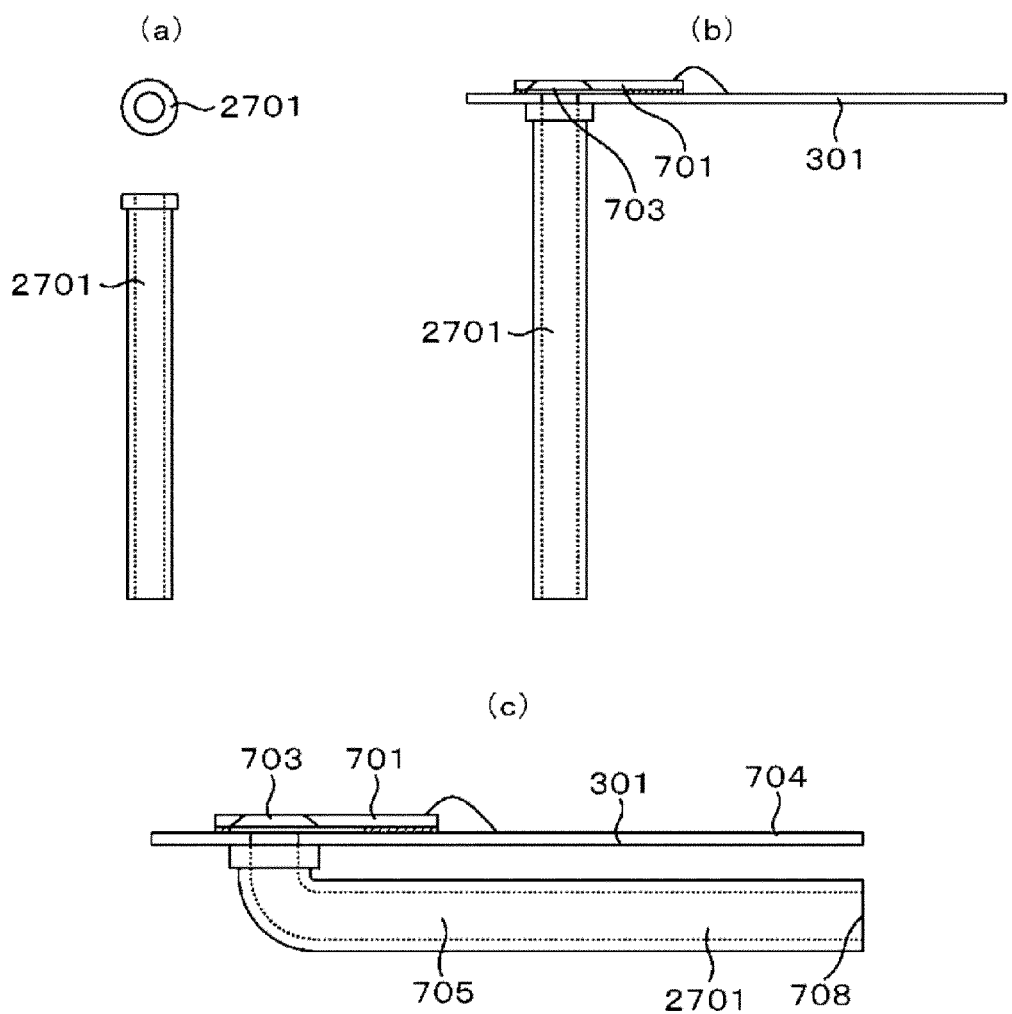
FIG. 28 illustrates a method that is Embodiment 14 to form a communication hole using a pipe-formed member.

FIG. 28 illustrates another proposal to improve the reliability of connection between the cavity 703 below the diaphragm and the opening 708 of the communication hole, referring to FIG. 27. Embodiment 8 illustrates the configuration of disposing the cover frame 401 at the rear face of the communication hole of the lead frame 301. The present embodiment includes, instead of the cover frame 401, a pipe-formed member 2701 under the through hole that is bonded with adhesion or by welding. The pipe-formed member may be made of soft metal such as copper or a resin material having a melting point from about 100° C. to 200° C. or higher that is a temperature during injection for transfer molding, for example. After bonding to the lead frame 301, the pipe-formed member 2701 is bent toward the direction where the circuit chamber of the thermal flow meter 100 is disposed, which then becomes a lead frame assembly 704. The subsequent steps to manufacture the thermal flow meter are the same as those in Embodiment 8.

This can avoid a concern about the adhesive 404 protruding over the communication hole 705, which is due to the communication hole 705 made up of two members, and so the cavity 703 below the diaphragm and the opening 708 of the communication hole can be connected more reliably.

Embodiment 15

Figure 29:
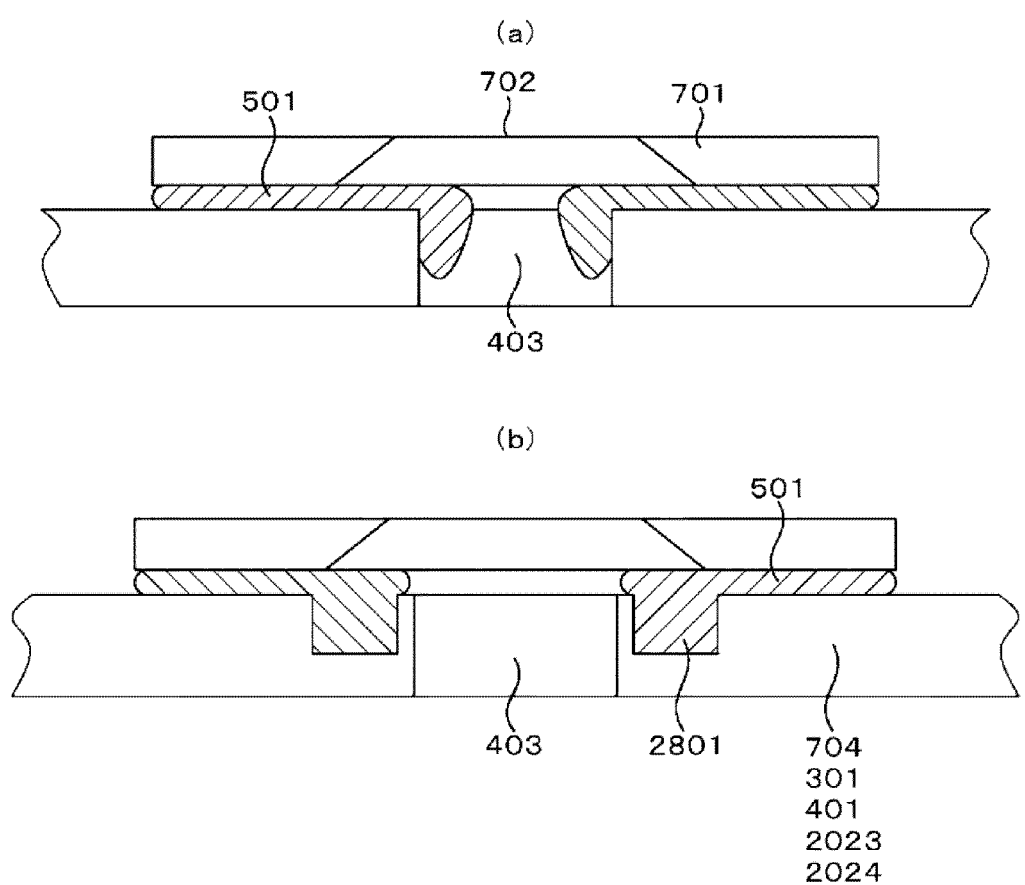
FIG. 29 illustrates a die-bond material receiver at the periphery of a through hole that is Embodiment 15.

FIG. 29 is an enlarged cross-sectional view of a plane that passes through the center line of the through hole 403. In the case of Embodiments 1 to 13, if the amount of the die-bond material 501 applied is not appropriate when the sensor element 701 is die-bonded on the lead frame 301, the cover frame 401 or the tab lead 2023, the die-bond material 501 will flow out to the through hole 403 as in FIG. 29(a) and may block the through hole 403. To prevent this, a die-bond material receiver 2801 is disposed so as to surround the through hole 403 as in FIG. 29(b). The die-bond material receiver 2801 is a recess that is lower than the applied face of the die-bond material 501 (dam structure), and so variations in the amount of the die-bond material 501 applied can be accommodated with the volume of the recess.

The present embodiment alleviates a concern about the die-bond material 501 to stick out over the through hole 403, and so the cavity 703 below the diaphragm and the opening 708 of the communication hole 705 can be connected more reliably.

REFERENCE SIGNS LIST 4, 360 Flow detection part
5 Driving circuit
6 Characteristic adjusting circuit
7 Heater resistor
8, 10 Fixed resistor
9 Non-thermal resistor
11 to 14 Temperature sensor (temperature detection resistor)
15 Operational amplifier
26 Constant voltage source
42 Electrode extraction part
99 Flange part
100 Thermal flow meter 101 Sub-passage
102 Circuit chamber
103 Connector part
104 Thermosetting adhesive
105 Upstream side opening
106 Downstream side opening
107, 701 Sensor element
108 Ventilation hole
109 Atmosphere outside intake pipe
110 Intake air
111 Connector lead
112 Aluminum wire
140 Intake pipe
201 Housing member
202 Cover member
203 Chip package
301 Lead frame
302 Outer frame
303 Die pad
304 Tie bar
305 Outer lead
306 Dam bar
331 Heater
332 Upstream side thermosensitive resistor
333 Downstream side thermosensitive resistor
401 Cover frame
402 Communication groove
403 Through hole
404 Adhesive
501 Die-bond material
503 Bonding part
504 Au wire
601 Resin part
602 Package assembly
702 Diaphragm
703 Cavity
704 Lead frame (lead frame assembly)
705 Communication hole
708 Opening of communication hole
1101 Cutting line of outer lead making up communication hole
1102 Upper mold for transfer molding
1103 Lower mold for transfer molding
1201 Upper side face of communication groove
1301 Chip
1302 Part without communication hole 705
2023 Tab lead
2024 Main frame
2201 Mountain folding line
2202 Position to mount sensor element
2301 Lead frame opening
2601 Package opening
2602 Pin
2701 Pipe-formed member
2801 Die-bond material receiver

The invention claimed is:

1. An airflow measuring apparatus comprising: a sub-passage that takes in a part of a flow of fluid flowing through an intake pipe; a sensor element that is disposed in the sub-passage to measure the flow of fluid; a circuit part that converts the flow of fluid detected by the sensor element into an electric signal; a connector part having a connector that is electrically connected to the circuit part to output a signal externally; and a casing that supports the sensor element and the circuit part, the sensor element being disposed in the intake pipe, wherein the sensor element includes a cavity that is disposed at a semiconductor substrate, and a diaphragm including a thin film part that covers the cavity, the sensor element is mounted at a lead frame, the sensor element and the lead frame have surfaces that are mold-packaged with resin so that a diaphragm part of the sensor element and a part of the lead frame are exposed to the sub-passage, and a hole is disposed at the lead frame to facilitate communication between the cavity and exterior of the mold package, and wherein the airflow measuring apparatus further includes a passage to communicate from the hole disposed at the lead frame to interior of the connector part or an engine room of a vehicle through a flange part via an interior of the lead frame.

2. The airflow measuring apparatus according to claim 1, wherein the lead frame and a metal terminal of the connector are made of different members, at least one space is disposed between a part of the casing that is exposed to the intake pipe and the flange, the space being to join the lead frame that is exposed from the mold package to the metal terminal, a second hole is disposed to join the space to the connector part or the flange part, and communication to the space is established from the hole disposed at the lead frame through the interior of the lead frame.

3. The airflow measuring apparatus according to claim 1, wherein the lead frame at least includes two members including a first lead frame, at which the sensor element is to be mounted, and a second lead frame that is to be bonded to the first lead frame for adhesion.

4. The airflow measuring apparatus according to claim 3, wherein the first lead frame includes a through hole at a position facing an enclosed space that is defined with the first lead frame and the cavity of the sensor element mounted thereon, a groove is disposed at any one of or both of the bonding face of the first lead frame and the bonding face of the second lead frame, the groove being along a longitudinal direction of the lead frame, and a passage is defined by bonding the first and the second lead frames.

5. The airflow measuring apparatus according to claim 4, wherein the first lead frame includes a groove on the side of the bonding face with the second lead frame and a second through hole at a part of the groove that is away from the through hole, and the second through hole communicates with exterior of the mold package.

6. The airflow measuring apparatus according to claim 5, wherein the second through hole is bored so as to penetrate through a mold part of the mold package toward a direction perpendicular to the sensor-element mounting face or toward a side face direction thereof.

7. The airflow measuring apparatus according to claim 4, wherein a section of the bonded faces of the first and the second lead frames defines an aperture of the passage to exterior of the mold package.

8. The airflow measuring apparatus according claim 3, wherein the first lead frame and the second lead frame of the lead frame are prepared by bending one lead frame.

9. The airflow measuring apparatus according to claim 3, wherein
the first lead frame comprises glass or silicon.

10. The airflow measuring apparatus according to claim 9, wherein
the through hole at the rear face of the diaphragm, which is disposed at the first lead frame, is formed by dry etching, wet etching or blasting.

11. The airflow measuring apparatus according to claim 1, further comprising: a pipe-formed member having one end face that is connected to the hole disposed at the lead frame, wherein
the other end face of the pipe-formed member is open to exterior of the mold package.

12. The airflow measuring apparatus according to claim 1, wherein
the hole includes a through hole that is disposed at the lead frame at a position facing an enclosed space that is defined with the lead frame and the cavity of the sensor element mounted at the lead frame, and a connection hole to connect to exterior of the mold package, and
the through hole and the communication hole are disposed at a same member and mutually intersect.

13. The airflow measuring apparatus according to claim 1, wherein
the lead frame includes a dam structure at a periphery of the hole disposed at the lead frame, the dam-structure having a shape along an etching opening shape at the rear face of the diaphragm.

14. A method for manufacturing an airflow measuring apparatus including: a sub-passage that takes in a part of a flow of fluid flowing through an intake pipe; a sensor element that is disposed in the sub-passage to measure the flow of fluid; a circuit part that converts the flow of fluid detected by the sensor element into an electric signal; a connector part having a connector that is electrically connected to the circuit part to output a signal externally; and a casing that supports the sensor element and the circuit part, the sensor element being disposed in the intake pipe, the sensor element including a cavity that is disposed at a semiconductor substrate, and a diaphragm including a thin film part that covers the cavity, the sensor element being mounted at a lead frame, the method comprising:
a first step of mounting the sensor element at the lead frame; and
a second step of performing mold-package of surfaces of the sensor element and the lead frame with resin so that a diaphragm part of the sensor element and a part of the lead frame are exposed,
wherein prior the second step, the method further comprises:
a hole forming step of forming a through hole that is to be disposed at the lead frame at a position facing an enclosed space that is defined with the lead frame and the cavity of the sensor element, and a connection hole to connect to exterior of the mold package,
wherein the hole forming step includes a processing step of forming a groove to form the through hole and the connection hole by etching or pressing, and
wherein the method further comprises:
bending one lead frame to form a first lead frame and a second lead frame as the lead frame;
a passage forming step of, following the hole forming step, bonding the first and the second lead frames to form a passage inside the lead frame; and
following the second step, cutting the passage partially to form an aperture leading to exterior of the mold package.

15. The method for manufacturing an airflow measuring apparatus according to claim 14, wherein
the hole forming step further includes forming a second through hole at a part of the groove that is away from the through hole, a part of the second through hole being formed with a mold of the mold package.

* * * * *